(12) United States Patent
Cheng et al.

(10) Patent No.: US 10,784,383 B2
(45) Date of Patent: Sep. 22, 2020

(54) CONDUCTIVE PASTE COMPOSITION AND SEMICONDUCTOR DEVICES MADE THEREWITH

(71) Applicant: E I DU PONT DE NEMOURS AND COMPANY, Wilmington, DE (US)

(72) Inventors: Lapkin K Cheng, Bear, DE (US); Kurt Richard Mikeska, Hockessin, DE (US)

(73) Assignee: E I DU PONT DE NEMOURS AND COMPANY, Wilmington, DE (US)

(*) Notice: Subject to any disclaimer, the term of this patent is extended or adjusted under 35 U.S.C. 154(b) by 0 days.

(21) Appl. No.: 15/217,272

(22) Filed: Jul. 22, 2016

(65) Prior Publication Data

US 2017/0040470 A1    Feb. 9, 2017

Related U.S. Application Data

(60) Provisional application No. 62/202,258, filed on Aug. 7, 2015.

(51) Int. Cl.

| | | |
|---|---|---|
| H01L 31/0224 | (2006.01) | |
| H01L 31/068 | (2012.01) | |
| H01B 1/22 | (2006.01) | |
| C03C 8/04 | (2006.01) | |
| C03C 8/10 | (2006.01) | |
| C03C 8/18 | (2006.01) | |

(52) U.S. Cl.
CPC ........ *H01L 31/022425* (2013.01); *C03C 8/04* (2013.01); *C03C 8/10* (2013.01); *C03C 8/18* (2013.01); *H01B 1/22* (2013.01); *H01L 31/068* (2013.01); *Y02E 10/547* (2013.01)

(58) Field of Classification Search
CPC . H01L 31/022425; H01L 31/068; H01B 1/16; H01B 1/22; C03C 8/14; C03C 8/18
See application file for complete search history.

(56) References Cited

U.S. PATENT DOCUMENTS

| 4,153,907 A | 5/1979 | Kofron |
|---|---|---|
| 4,256,513 A | 3/1981 | Yoshida et al. |

(Continued)

FOREIGN PATENT DOCUMENTS

| CN | 101651155 A | * | 2/2010 |
|---|---|---|---|
| CN | 102568652 A | | 7/2012 |

(Continued)

OTHER PUBLICATIONS

Konig et al., "Advanced Model for the Contact Formation of Al-Containing Ag Thick Film Paste on Boron-Doped Emitter of Si Solar Cells", NPV Workshop, Chambery, Apr. 22, 2013, Heraeus Precious Metals GMBH & Co. KG—TFD-PV.

(Continued)

*Primary Examiner* — Matthew T Martin

(57) ABSTRACT

A conductive paste composition contains a source of an electrically conductive metal, a first oxide component, a second, non-oxide, magnesium-containing component, and an organic vehicle. An article such as a high-efficiency photovoltaic cell is formed by a process of deposition of the paste composition on a semiconductor device substrate (e.g., by screen printing) and firing the paste to remove the organic vehicle and sinter the metal and establish electrical contact between it and the substrate.

20 Claims, 2 Drawing Sheets

(56) References Cited

U.S. PATENT DOCUMENTS

| | | | |
|---|---|---|---|
| 4,336,281 A | 6/1982 | van Mourik | |
| 4,342,795 A | 8/1982 | Marcus et al. | |
| 4,375,007 A | 2/1983 | Marcus | |
| 4,486,232 A | 12/1984 | Nakatani et al. | |
| 5,468,652 A | 11/1995 | Gee | |
| 6,384,316 B1 | 5/2002 | Shinohara et al. | |
| 7,494,607 B2 | 2/2009 | Wang et al. | |
| 7,704,416 B2 | 4/2010 | Inaba et al. | |
| 7,780,878 B2 * | 8/2010 | Young | C03C 8/14 252/514 |
| 7,976,734 B2 | 7/2011 | Akimoto | |
| 7,976,735 B2 | 7/2011 | Akimoto | |
| 8,652,873 B1 | 2/2014 | Hang et al. | |
| 8,759,668 B2 | 6/2014 | Salami et al. | |
| 9,048,374 B1 | 6/2015 | Scardera et al. | |
| 2006/0289055 A1 | 12/2006 | Sridharan et al. | |
| 2008/0230119 A1 | 9/2008 | Akimoto | |
| 2008/0251119 A1 | 10/2008 | Forehand | |
| 2009/0095344 A1 | 4/2009 | Machida et al. | |
| 2009/0266409 A1 * | 10/2009 | Wang | H01B 1/16 136/252 |
| 2011/0223712 A1 | 9/2011 | Akimoto | |
| 2011/0315220 A1 | 12/2011 | Korevaar et al. | |
| 2012/0006393 A1 | 1/2012 | Cruz et al. | |
| 2012/0031484 A1 | 2/2012 | Matsuno et al. | |
| 2012/0164777 A1 | 6/2012 | Kleine Jaeger et al. | |
| 2012/0255605 A1 | 10/2012 | Takeda | |
| 2013/0061919 A1 | 3/2013 | Carroll et al. | |
| 2013/0068290 A1 | 3/2013 | Hang et al. | |
| 2013/0098431 A1 | 4/2013 | Chen et al. | |
| 2013/0277624 A1 | 10/2013 | Yang et al. | |
| 2014/0042375 A1 | 2/2014 | Kim et al. | |
| 2014/0261662 A1 | 9/2014 | Floyd et al. | |
| 2015/0027524 A1 | 1/2015 | Seyedmohammadi et al. | |

FOREIGN PATENT DOCUMENTS

| | | | | |
|---|---|---|---|---|
| CN | 103311367 A | 9/2013 | | |
| CN | 103547542 A | 1/2014 | | |
| CN | 104170094 A | 11/2014 | | |
| EP | 2323171 A | 5/2011 | | |
| JP | 2985503 B2 | 12/1999 | | |
| JP | 3297007 B2 | 7/2002 | | |
| JP | 2007141950 A | 6/2007 | | |
| JP | 2012221640 A | 11/2012 | | |
| WO | 2009/110409 A1 | 9/2009 | | |
| WO | 2010/123967 A2 | 10/2010 | | |
| WO | 2013/036510 A1 | 3/2013 | | |
| WO | 2013/158864 A1 | 10/2013 | | |
| WO | 2014/102003 A1 | 7/2014 | | |
| WO | 2014/161641 A1 | 10/2014 | | |
| WO | WO-2014161641 A1 * | 10/2014 | | C03C 8/18 |

OTHER PUBLICATIONS

Cheng et al., "Nano-Ag Colloids Assisted Tunneling Mechanism for Current Condition in Front Contact of Crystalline Si Solar Cells", Dupont Central Research and Development.

Cotter et al., "P-Type Versus N-Type Silicon Wafers: Prospects for High-Efficiency Commercial Silicon Solar Cells", IEEE Transactions on Electron Devices, Aug. 2006, pp. 1893-1901, vol. 53, No. 8.

Liang et al., "Current Conduction Mechanism of Front-Side Contact of N-Type Crystalline Si Solar Cells With Ag/Al/Pastes", IEEE Journal of Photovoltaics, 2013, pp. 2156-3381.

Lago et al., "Screen Printing Metallization of Boron Emitters", Progress in Photovoltaics: Research and Applications, 2010, pp. 20-27, vol. 18, Wiley Interscience.

Li et al., "Electron Microscopy Study of Front-Side Ag Contact in Crystalline Si Solar Cells", Journal of Applied Physics, 2009, vol. 105.

Li et al., "Microstructural Comparison of Silicon Solar Cells' Front-Side Ag Contact and the Evolution of Current Conduction Mechanisms", Journal of Applied Physics, 2011, vol. 110.

Riegel et al., "3rd Workshop on Metallization for Crystalline Silicon Solar Cells", Energy Procedia, 2012, pp. 14-23, vol. 21, SCIVERSE SCIENCEDIRECT.

Hoornstra et al., "Lead Free Metallisation Paste for Crystalline Silicon Solar Cells: From Model to Results", 31st IEEE PVSC Florida, 2005.

Schmidt et al., "N-Type Silicon—The Better Material Choice for Industrial High Efficiency Solar Cells", 22nd European Photovoltaic Solar Energy Conference, Sep. 3-7, 2007, Milan, Italy.

Tool et al., "Solar Cells on the N-Type Multicrystalline Silicon Wafers by Industrial Processing Techniques", 19th EU PVSEC, Jun. 2004, Paris.

* cited by examiner

CONDUCTIVE PASTE COMPOSITION AND SEMICONDUCTOR DEVICES MADE THEREWITH

CROSS-REFERENCE TO RELATED APPLICATION

This application claims benefit of U.S. Provisional Patent Application Ser. No. 62/202,258, filed Aug. 7, 2015, and entitled "Conductive Paste Composition And Semiconductor Devices Made Therewith." Said application is incorporated herein in its entirety for all purposes by reference thereto.

FIELD OF THE INVENTION

The present disclosure relates to a conductive paste composition that is useful in the construction of a variety of electrical and electronic devices, and more particularly to a paste composition useful in creating conductive structures, including electrodes for photovoltaic devices; devices constructed with such paste compositions; and a process for constructing these devices.

TECHNICAL BACKGROUND

A conventional photovoltaic cell incorporates a semiconductor structure with a junction between semiconducting materials with different majority-carrier conductivity types, such as a p-n junction formed between an n-type semiconductor and a p-type semiconductor. More specifically, crystalline Si photovoltaic cells are typically made by adding controlled impurities (called dopants) to purified silicon, which is an intrinsic semiconductor. Dopants from IUPAC group 13 (e.g., B) are termed "acceptor dopants" and produce p-type material, in which the majority charge carriers are positive "holes," or electron vacancies. Dopants from IUPAC group 15 (e.g., P) are termed "donor dopants" and produce n-type material, in which the majority charge carriers are negative electrons. Dopants may be added to bulk materials by direct inclusion in the melt during silicon crystal growth. Doping of a surface is often accomplished by providing the dopant at the surface in either liquid or gaseous form, and then thermally treating the base semiconductor to cause the dopants to diffuse inward. Ion implantation, possibly with further heat treatment, is also used for surface doping.

The cell structure includes a boundary or junction between p-type and n-type Si. When the cell is illuminated by electromagnetic radiation of an appropriate wavelength, such as sunlight, a potential (voltage) difference develops across the junction as the electron-hole pair charge carriers migrate into the electric field region of the p-n junction and become separated. The spatially separated charge carriers are collected by electrodes in contact with the surfaces of the semiconductor. The cell is thus adapted to supply electric current to an electrical load connected to the electrodes, thereby providing electrical energy converted from the incoming light energy that can do useful work. Since sunlight is almost always used, photovoltaic cells are commonly known as "solar cells."

In the commonly used planar p-base configuration, a negative electrode is located on the side of the cell that is to be exposed to a light source (the "front" or "light-receiving" side, which in the case of an ordinary solar cell is the side exposed to sunlight), and a positive electrode is located on the other side of the cell (the "back" or "non-illuminated" side). Cells having a planar n-base configuration, in which the p- and n-type regions are interchanged from the p-base configuration, are also known. Solar-powered photovoltaic systems are considered to be environmentally beneficial in that they reduce the need for burning fossil fuels in conventional electric power plants.

Industrial photovoltaic cells are commonly provided in the form of a structure, such as one based on a doped crystalline silicon wafer, that has been metallized, i.e., provided with electrodes in the form of electrically conductive metal contacts through which the generated current can flow to an external electrical circuit load. Most commonly, these electrodes are provided on opposite sides of a generally planar cell structure. Conventionally, they are produced by applying suitable conductive metal pastes to the respective surfaces of the semiconductor body and thereafter firing the pastes.

Photovoltaic cells are commonly fabricated with an insulating layer on their front side to afford an anti-reflective property that maximizes the utilization of incident light. However, in this configuration, the insulating layer normally must be removed to allow an overlaid front-side electrode to make contact with the underlying semiconductor surface. Conductive metal pastes typically appointed for forming front side electrodes include a glass frit and a conductive species (e.g., silver particles) carried in an organic medium that functions as a vehicle for printing. The electrode may be formed by depositing the paste composition in a suitable pattern (for instance, by screen printing) and thereafter firing the paste composition and substrate to dissolve or otherwise penetrate the insulating, anti-reflective layer and sinter the metal powder, such that an electrical connection with the semiconductor structure is formed.

The ability of the paste composition to penetrate or etch through the anti-reflective layer and form a strongly adhering bond between the electrode and the substrate upon firing is highly but unpredictably dependent on the composition of the conductive paste and the firing conditions. Key measures of photovoltaic cell electrical performance, such as light conversion efficiency, are also influenced by the quality of the electrical contact made between the fired conductive paste and the underlying substrate.

Although various methods and compositions useful in forming devices such as photovoltaic cells are known, there nevertheless remains a need for compositions that permit fabrication of patterned conductive structures that provide improved overall device electrical performance and that facilitate the efficient manufacture of such devices in both conventional and novel architectures.

SUMMARY OF THE INVENTION

An embodiment of the present disclosure provides a paste composition, comprising:
  an inorganic solids portion that comprises:
   (a) a first oxide component,
   (b) a second, non-oxide, magnesium-containing component, and
   (c) a source of electrically conductive metal consisting essentially of Ag, Au, Cu, Ni, Pd, Pt, or a mixture or alloy thereof, and
  an organic vehicle in which the constituents of the inorganic solids portion are dispersed.

Another embodiment provides a process for forming on a substrate an electrically conductive structure comprising at least one electrode, the process comprising:

a) providing a substrate having opposed first and second major surfaces;

b) applying a paste composition onto a preselected portion of the first major surface; and c) firing the substrate and the paste composition thereon for a time and at a temperature sufficient to form the electrically conductive structure with electrical contact established between the at least one electrode and the preselected portion, wherein the paste composition comprises:

an inorganic solids portion that comprises:

(a) a first oxide component, (b) a second, non-oxide, magnesium-containing component, and (c) a source of an electrically conductive metal consisting essentially of Ag, Au, Cu, Ni, Pd, Pt, or a mixture or alloy thereof; and an organic vehicle in which the constituents of the inorganic solids portion are dispersed.

Still another embodiment provides an article comprising a substrate and an electrically conductive structure thereon, the article having been formed by a process comprising:

(a) providing a substrate having opposed first and second major surfaces;

(b) applying a paste composition onto a preselected portion of the first major surface; and (c) firing the substrate and the paste composition thereon for a time and at a temperature sufficient to form the electrically conductive structure with electrical contact established between the at least one electrode and the preselected portion, wherein the paste composition comprises:

an inorganic solids portion that comprises:

(a) a first oxide component, (b) a second, non-oxide, magnesium-containing component, and (c) a source of an electrically conductive metal consisting essentially of Ag, Au, Cu, Ni, Pd, Pt, or a mixture or alloy thereof; and an organic vehicle in which the constituents of the inorganic solids portion are dispersed.

A yet further embodiment provides a photovoltaic cell precursor, comprising:

a substrate having opposed first and second major surfaces; and a paste composition that comprises:

an inorganic solids portion that comprises:

a) a first oxide component, b) a second, non-oxide, magnesium-containing component, and c) a source of an electrically conductive metal consisting essentially of Ag, Au, Cu, Ni, Pd, Pt, or a mixture or alloy thereof, and an organic vehicle in which the constituents of the inorganic solids portion are dispersed;

and wherein the paste composition is applied onto a preselected portion of the first major surface and is configured to be formed by a firing operation into an electrically conductive structure comprising an electrode in electrical contact with the substrate.

Still further, there is disclosed an article that is formed using the present paste composition in conjunction with the foregoing process. Such articles include semiconductor devices and photovoltaic cells. The present processes can be used to form electrodes contacting either p-type or n-type regions of silicon semiconductors, the electrodes comprising electrically conductive structures formed by any of the processes described herein.

BRIEF DESCRIPTION OF THE DRAWINGS

The invention will be more fully understood and further advantages will become apparent when reference is made to the following detailed description of the preferred embodiments of the invention and the accompanying drawings, wherein like reference numerals denote similar elements throughout the several views and in which.

Figure 1A:
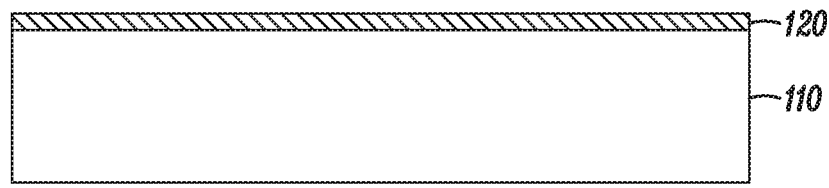
FIGS. 1A-1F illustrate successive steps of a process by which an exemplary n-base photovoltaic cell may be fabricated. This also may be incorporated into a photovoltaic cell. Reference numerals as used in FIGS. 1A-1F include the following.

110: n-type substrate;
120: p-type emitter;
130a: front major surface passivation layer;
130b: rear major surface passivation layer;
140: $n^+$ layer;
160: conductive paste;
161: p-type electrode;
170: conductive paste; and
171: n-type electrode.

DETAILED DESCRIPTION

Various aspects of the present disclosure relate to the need for high performance semiconductor and other electronic devices having mechanically robust and durable, high conductivity electrodes as well as processes suitable for their manufacture.

In one aspect, the conductive paste composition provided herein is beneficially employed in the fabrication of such electrodes of photovoltaic devices. Ideally, a paste composition promotes the formation of a metallization that: (a) adheres strongly to the underlying semiconductor substrate; and (b) provides a relatively low resistance contact with the substrate. Suitable paste compositions are believed to aid in etching surface insulating layers, which are ordinarily included in semiconductor structures such as photovoltaic cells, as required to establish good contact between the conductive electrode and the underlying semiconductor.

An aspect provides a paste composition that comprises: a functional conductive component, such as a source of electrically conductive metal; a first, fusible oxide component; a second, non-oxide, magnesium-containing component; and an organic vehicle. Certain embodiments involve a photovoltaic cell that includes one or more conductive structures made with the present paste composition. Such cells may provide in some implementations any combination of one or more of high photovoltaic conversion efficiency, high fill factor, and low series resistance.

In certain embodiments, the present paste composition may comprise an inorganic solids portion comprising (a) about 75% to about 99.5% by weight, or about 90% to about 99% by weight, or about 95% to about 99% by weight, of a source of an electrically conductive metal; (b) about 1% to about 15% by weight, or about 1% to about 8% by weight, or about 2% to about 6% by weight, or about 1% to about 5% by weight, or about 1% to about 3% by weight, of a first, oxide-based component; and (c) up to about 2%, 4%, 6%, or 8% of a non-oxide, Mg-containing second component. The above stated contents of constituents (a), (b), and (c) are based on the total weight of all the constituents of the inorganic solids portion of the composition, apart from the organic medium.

As further described below, the paste composition also comprises an organic vehicle, which acts as a carrier for the inorganic constituents, which are dispersed therein. Along with solvent, the organic vehicle may include one or more components such as polymers, surfactants, thickeners, thixotropes, and binders that may impart desired functional properties, including without limitation ones desirable in deposition and electrode formation processes.

Typically, electrodes or other like conductive traces are provided by screen printing the paste composition onto a substrate, although other forms of deposition may alternatively be used, including without limitation plating, extrusion or co-extrusion, dispensing from a syringe, inkjet, shaped, multiple, or ribbon printing. After deposition, the composition is fired at an elevated temperature. A separate drying step is optionally carried out prior to the actual firing.

The composition also can be used to form conductive traces for other purposes, such as those employed in a semiconductor module that is to be incorporated into an electrical or electronic device. As would be recognized by a skilled artisan, the paste composition described herein can be termed "conductive," meaning that the composition can be formed into a structure and thereafter processed to exhibit an electrical conductivity sufficient for conducting electrical current between devices and circuitry connected thereto.

I. Inorganic Components

An aspect of the present disclosure relates to a paste composition, which may include: an inorganic solids portion comprising a functional material providing electrical conductivity, a first oxide component, and a second, non-oxide, magnesium-containing component; and an organic vehicle in which the inorganic solids are dispersed.

A. Electrically Conductive Metal

The present paste composition includes a functional material providing electrical conductivity. In an implementation, the conductivity is provided by a metal that consists essentially of silver, gold, copper, nickel, palladium, platinum, or alloys or mixtures thereof. Silver is preferred for its processability and high conductivity. In some embodiments, the electrically conductive metal consists essentially of silver. However, a composition including at least some non-precious metal may be used to reduce cost or to modify other properties. The metal may include impurities typically found after conventional industrial processing.

The conductive metal may be incorporated directly in the present paste composition as a metal powder. In another embodiment, a mixture of two or more such metals or an alloy is directly incorporated. Alternatively, the metal is supplied by a metal oxide or salt that decomposes upon exposure to the heat of firing to form the metal. As used herein, the term "silver" is to be understood as referring to elemental silver metal, alloys of silver, and mixtures thereof, and may further include silver derived from silver oxide ($Ag_2O$ or $AgO$) or silver salts such as $AgCl$, $AgNO_3$, $AgOOCCH_3$ (silver acetate), $AgOOCF_3$ (silver trifluoroacetate), $Ag_3PO_4$ (silver orthophosphate), or mixtures thereof. Any other form of conductive metal compatible with the other components of the paste composition also may be used in certain embodiments. Other metals used in the present paste for the functional conductive material may be similarly derived.

In an embodiment, the electrically conductive metal is substantially Al-free, meaning that the paste composition does not include aluminum (Al) metal or any aluminum-containing material that decomposes to provide aluminum metal or aluminum-containing metal or metal alloy, with that the amount of aluminum present as an impurity ordinarily being less than 0.1 wt. %. However, it is understood that the oxide component may still contain aluminum oxide.

Electrically conductive metal powder used in the present paste composition may be supplied as finely divided particles having any morphology, including without limitation, any one or more of the following morphologies: a powder form, a flake form, a spherical form, a rod form, a granular form, a nodular form, a layered or coated form, other irregular forms, or mixtures thereof. The electrically conductive metal or source thereof may also be provided in a colloidal suspension, in which case the colloidal carrier would not be included in any calculation of weight percentages of the solids of which the colloidal material is part.

The particle size of the metal is not subject to any particular limitation. As used herein, "particle size" is intended to refer to "median particle size" or $d_{50}$, by which is meant the 50% volume distribution size. The particle size distribution may also be characterized by $d_{90}$, meaning that 90% by volume of the particles are smaller than $d_{90}$. Volume distribution size may be determined by a number of methods understood by one of skill in the art, including but not limited to laser diffraction and dispersion methods employed by a Microtrac particle size analyzer (Montgomeryville, Pa.). Laser light scattering, e.g., using a model LA-910 particle size analyzer available commercially from Horiba Instruments Inc. (Irvine, Calif.), may also be used. In various embodiments, the median size of the metal particles is greater than 0.2 μm and less than 10 μm, or the median particle size is greater than 0.4 μm and less than 5 μm, as measured using the Horiba LA-910 analyzer.

As further described below, the electrically conductive metal or a source thereof can be dispersed in an organic vehicle that acts as a carrier for the metal phase and other constituents present in the formulation. The electrically conductive metal may comprise any of a variety of percentages of the composition of the paste composition. To attain high conductivity in a finished conductive structure, it is generally preferable for the concentration of the electrically conductive metal to be as high as possible while maintaining other required characteristics of the paste composition that relate to either processing or final use, such as the need for a uniform, mechanically robust and adherent contact and adequate penetration of any surface passivation and/or anti-reflective coating present on the substrate. Minimizing the bulk resistivity and the contact resistance between the conductive structure and the underlying device beneficially tends to decrease the source resistance of a device.

The conductive metal is present in some embodiments in an amount ranging from a metal source lower limit to a metal source upper limit, the metal source lower limit being one of 70%, 75%, 80%, or 85%, and the metal source upper limit being one of 85%, 90%, 95%, 99%, or 99.5%, based on the weight of the inorganic solids. Alternatively, the conductive metal may be included in the paste composition in an amount ranging from a metal lower limit to a metal upper limit, the metal lower limit being one of 65%, 70%, 75%, 80%, or 85%, and the metal upper limit being one of 85%, 90%, 95%, or 97%, based on the weight of the paste composition. In some embodiments, the conductive metal powder may be coated with another metal or other material to alter its reactivity.

In an embodiment, the solids portion of the paste composition may include about 80 wt. % to about 90 wt. % silver particles and about 1 wt. % to about 9 wt. % silver flakes.

In another embodiment, the solids portion of the paste composition may include about 70 wt. % to about 90 wt. % silver particles and about 1 wt. % to about 9 wt. % silver flakes. In another embodiment, the solids portion of the paste composition may include about 70 wt. % to about 90 wt. % silver flakes and about 1 wt. % to about 9 wt. % of colloidal silver. In a still further embodiment, the solids portion of the paste composition may include about 60 wt. % to about 90 wt. % of silver particles or silver flakes and about 0.1 wt. % to about 20 wt. % of colloidal silver.

The electrically conductive metal used herein, particularly when in powder form, may be coated or uncoated; for example, it may be a powder at least partially coated with a surfactant to facilitate processing. Suitable coating surfactants include, for example, stearic acid, palmitic acid, a salt of stearate, a salt of palm itate, and mixtures thereof. Other surfactants that also may be utilized include lauric acid, oleic acid, capric acid, myristic acid, linoleic acid, and mixtures thereof. Still other surfactants that also may be utilized include polyethylene oxide, polyethylene glycol, benzotriazole, poly(ethylene glycol)acetic acid, and other similar organic molecules. Suitable counter-ions for use in a coating surfactant include without limitation hydrogen, ammonium, sodium, potassium, and mixtures thereof. When the electrically conductive metal is silver, it may be coated, for example, with a phosphorus-containing compound.

In an embodiment, one or more surfactants may be included in the organic vehicle in addition to any surfactant included as a coating of conductive metal powder used in the present paste composition.

B. Oxide Component

The present paste composition includes an oxide component, which is understood to refer to a chemical composition containing anions of one or more types, of which at least 80% are oxygen anions, and cations. The oxide component may comprise either a single, homogeneously and intimately mixed material or plural constituent materials that have different, identifiable compositions. A wide variety of oxide components may be included in the present paste composition. In some embodiments, the oxide component can act in concert with the Mg-containing component described below to permit use of the paste in forming electrodes that adhere strongly to a p-doped region of a Si photovoltaic cell wafer and provide a low resistance electrical contact.

The anions and cations of the oxide composition described herein may be intimately mixed, meaning that the constituent anions and cations are homogeneously chemically mixed at an atomic level during preparation of the composition. For example, the material in the composition may be subjected to melting or other operations to effect intimate mixing. It is to be understood that upon cooling after being fully melted some mixed oxides may phase segregate in a microstructure having grains, regions, or domains having different compositions. Such a microstructure is still to be regarded as having intimately mixed cations.

Such intimate mixing is distinguished from a physical mixing, after which multiple constituent, possibly particulate, materials made up of macroscopic particles remain differentiated throughout the entire preparation, e.g. as would result from the mixing different powders without melting them together at any point.

The oxide composition incorporated in the inorganic solids portion of the present paste composition may be provided as a finely divided powder, and may be either crystalline or partially or fully glassy or amorphous. Depending on its elemental content and preparation history, an oxide composition that is partially or fully crystalline may comprise a single or multiple crystalline phases. As recognized by a skilled person, melting and then solidifying a composition that does not correspond to a single crystalline phase in some instances may result in a microstructure having regions with different compositions and atomic structure, even though the various constituent elements initially were intimately mixed by complete melting.

The oxide component of the present paste composition is a fusible material. The term "fusible," as used herein, refers to the ability of a material to become fluid upon heating, such as the heating employed in a firing operation. In some embodiments, the fusible material is composed of one or more fusible subcomponents. For example, the fusible material may comprise a glass material, or a mixture of two or more glass materials. Glass material in the form of a fine powder, e.g., as the result of a comminution operation, is often termed "frit" and is readily incorporated in the present paste composition. Of course, crystalline materials incorporated in the present paste composition may also be fusible.

As used herein, the term "glass" refers to a particulate solid form, such as an oxide or oxyfluoride, that is at least predominantly amorphous, meaning that short-range atomic order is preserved in the immediate vicinity of any selected atom, that is, in the first coordination shell, but dissipates at greater atomic-level distances (i.e., there is no long-range periodic order). Hence, the X-ray diffraction pattern of a fully amorphous material exhibits broad, diffuse peaks, and not the well-defined, narrow peaks of a crystalline material. In the latter, the regular spacing of characteristic crystallographic planes give rise to the narrow peaks, whose position in reciprocal space is in accordance with Bragg's law. In this specification, "softening point" is determined by differential thermal analysis (DTA). In general, the first evolution peak in a DTA scan is at the glass transition temperature (Tg), the second evolution peak is at the glass softening point (Ts), and the third evolution peak is at the crystallization point. The third evolution peak would not appear upon firing at 0 to 800° C. in the DTA of a noncrystalline glass.

In an embodiment, the softening point of glass material used in the present paste composition is in the range of 300 to 800° C. In other embodiments, the softening point is in the range of 250 to 650° C., or 300 to 500° C., or 300 to 400° C.

It is contemplated that some or all of the oxide component herein may be composed of material that exhibits some degree of crystallinity. For example, in some embodiments, a plurality of oxides are melted together, resulting in a material that is partially amorphous and partially crystalline. As would be recognized by a skilled person, such a material would produce an X-ray diffraction pattern having narrow, crystalline peaks superimposed on a pattern with broad, diffuse peaks. Alternatively, one or more constituents, or even substantially all of the fusible material, may be predominantly or even substantially fully crystalline. In an embodiment, crystalline material useful in the fusible material of the present paste composition may have a melting point of at most 750, 800, or 850° C.

Although oxygen is typically the predominant anion in the oxide component, some portion of the oxygen may be replaced by fluorine or other halide anions to alter certain properties, such as chemical, thermal, or rheological properties, of the oxide component that affect firing. In an embodiment, up to 10% of the oxygen anions of the oxide composition in any of the formulations of the present paste composition are replaced by one or more halogen anions, including fluorine. Halogen anions may be supplied from halides of any of the composition's cations.

One of ordinary skill in the art of glass chemistry would recognize that various components of the present paste composition, including the oxide component, are described herein as including percentages of certain components. Specifically, the composition of these substances are specified by denominating individual components that may be combined in the specified percentages to form a starting material that subsequently is processed, e.g., as described herein, to form a glass or other fusible material. Such nomenclature is conventional to one of skill in the art. In other words, the oxide component contains certain components, and the percentages of those components may be expressed as weight percentages of the corresponding oxide or other forms.

Alternatively, some of the compositions herein are set forth by cation percentages, which are based on the total cations contained in the particular material. Of course, compositions thus specified include the oxygen or other anions associated with the various cations. A skilled person would recognize that compositions could equivalently be specified by weight percentages of the constituents, and would be able to perform the required numerical conversions.

A skilled person would further recognize that any of the oxide compositions or other like materials herein, whether specified by weight percentages or cation percentages of the constituent oxides, may alternatively be prepared by supplying the required anions and cations in requisite amounts from different components that, when mixed and fired, yield the same overall composition. For example, in various embodiments, alkali metal cations ("A") could be supplied either directly from $A_2O$, or alternatively from a suitable organic or inorganic A-containing compound (such as $A_2CO_3$) that decomposes on heating to yield $A_2O$. The skilled person would also recognize that a certain portion of volatile species, e.g., carbon dioxide, may be released during the process of making a fusible material.

It is known to those skilled in the art that an oxide composition such as one prepared by a melting technique as described herein may be characterized by known analytical methods that include, but are not limited to: Inductively Coupled Plasma-Emission Spectroscopy (ICP-ES), Inductively Coupled Plasma-Atomic Emission Spectroscopy (ICP-AES), and the like. In addition, the following exemplary techniques may be used: X-Ray Fluorescence spectroscopy (XRF), Nuclear Magnetic Resonance spectroscopy (NMR), Electron Paramagnetic Resonance spectroscopy (EPR), Mössbauer spectroscopy, electron microprobe Energy Dispersive Spectroscopy (EDS), electron microprobe Wavelength Dispersive Spectroscopy (WDS), and Cathodoluminescence (CL). A skilled person could calculate percentages of starting components that could be processed to yield a particular fusible material, based on results obtained with such analytical methods.

In an embodiment, the oxide composition may be produced by conventional glass-making techniques and equipment. For example, the ingredients may be weighed and mixed in the requisite proportions and then heated in air in a platinum alloy crucible in a furnace. The ingredients may be heated to a peak temperature (e.g., 800° C. to 1400° C., or 1000° C. to 1200° C., or 900° C. to 1050° C.) and held for a time such that the material forms a melt that is substantially liquid and homogeneous (e.g., 20 minutes to 2 hours). The melt optionally is stirred, either intermittently or continuously. In an embodiment, the melting process results in a material wherein the constituent chemical elements are homogeneously and intimately mixed at an atomic level. The molten material is then typically quenched in any suitable way including, without limitation, passing it between counter-rotating stainless steel rollers to form 0.25 to 0.50 mm thick platelets, by pouring it onto a thick stainless steel plate, or by pouring it into a suitable quench fluid. The resulting particles are then milled to form a powder or frit. In a typical embodiment, the particles may have a $d_{50}$ of 0.2 to 3.0 μm, but particles of any suitable size may alternatively be used.

Other production techniques may also be used for the present oxide composition. One skilled in the art of producing such materials might therefore employ alternative synthesis techniques including, but not limited to, melting in non-precious metal crucibles, melting in ceramic crucibles, sol-gel, spray pyrolysis, or others appropriate for making powder forms of glass.

The oxide composition may be present in the paste composition in an amount ranging from a lower limit to an upper limit, the lower limit being one of 0.1%, 0.2%, 0.5%, 1%, 1.5%, or 2%, and the upper limit being one of 2.5%, 3%, 3.5%, 4%, 5%, 7.5%, or 10% by weight of the paste composition.

A median particle size of the oxide component may be in the range of about 0.5 to 10 μm, or about 0.8 to 5 μm, or about 1 to 3 μm, as measured using the Horiba LA-910 analyzer.

Any size-reduction method known to those skilled in the art can be employed to reduce particle size of the oxide and non-oxide constituents of the present paste composition to a desired level. Such processes include, without limitation, ball milling, media milling, jet milling, vibratory milling, and the like, with or without a solvent present. If a solvent is used, water is the preferred solvent, but other solvents may be employed as well, such as alcohols, ketones, and aromatics. Surfactants may be added to the solvent to aid in the dispersion of the particles, if desired.

Oxide-based fusible materials suitably employed in the present paste composition include, without limitation, lead borate, lead silicate, borosilicate, and alkali metal vanadate-based materials. Any of the fusible materials herein optionally include $Te_2O$.

Lead Borate Oxide Composition

As used herein, the term "lead borate oxide composition" refers to a composition containing at least lead (Pb) and boron (B) cations and oxygen (O) anions that are homogeneously mixed. Lead borate oxides useful in the present paste composition include ones in which the lead and boron cations together comprise at least 50%, 60%, 70%, 75%, 80%, 85%, 90%, or 95% of the total cations. In some embodiments, substantially all the anions are oxygen, while in others, up to 20% of the oxide anions are replaced with halogen or other anions.

In various embodiments, the lead borate oxide composition useful in the present paste composition comprises two or more intimately mixed oxides selected from the group consisting of lead oxide (PbO), silicon oxide ($SiO_2$), boron oxide ($B_2O_3$), and aluminum oxide ($Al_2O_3$). Examples of such embodiments include, without limitation:

PbO can be any of 40 to 80 mol %, 42 to 73 mol %, or 45 to 68 mol %;

$B_2O_3$ can be any of 15 to 48 mol %, 20 to 43 mol %, or 22 to 40 mol %;

$SiO_2$ can be any of 0 to 40 mol %, 0.5 to 36 mol %, 1 to 33 mol %, or 1.3 to 28 mol %; and $Al_2O_3$ can be any of 0 to 6 mol %, 0.01 to 5.5 mol %, 0.09 to 4.8 mol %, or 0.5 to 3 mol %, wherein the foregoing percentages are based on the total molar fraction of each component in the lead borate. Typically the lead borate is partially or fully glassy, and may include other oxides such as alkali metal or alkaline earth metal oxides.

Lead Silicate Oxide Composition

As used herein, the term "lead silicate oxide composition" refers to a composition containing at least lead (Pb) and silicon (Si) cations and oxygen (O) anions that are homogeneously mixed. Lead silicate oxides useful in the present paste composition include ones in which the lead and silicon cations together comprise at least 50%, 60%, 70%, 75%, 80%, 85%, 90%, or 95% of the total cations. In some embodiments, substantially all the anions are oxygen, while in others, up to 20% of the oxygen anions are replaced with halogen or other anions. Typically the lead silicate is partially or fully glassy, and may include other oxides such as alkali metal or alkaline earth metal oxides.

Lead-Free Oxide Composition

In various other embodiments, the oxide composition comprises a lead-free composition containing two or more oxides selected from a group consisting of boron oxide ($B_2O_3$), zinc oxide (ZnO), bismuth oxide ($Bi_2O_3$), silicon oxide ($SiO_2$), aluminum oxide ($Al_2O_3$), and barium oxide (BaO). In such embodiments:

$B_2O_3$ can be 20 to 48 mol %, 25 to 42 mol %, or 28 to 39 mol %;

ZnO can be 20 to 40 mol %, 25 to 38 mol %, 28 to 36 mol %;

$Bi_2O_3$ can be 15 to 40 mol %, 18 to 35 mol %, 19 to 30 mol %;

$SiO_2$ can be 0.5 to 20 mol %, 0.9 to 6 mol %, or 1 to 3 mol %;

$Al_2O_3$ can be 0.1 to 7 mol %, 0.5 to 5 mol %, or 0.9 to 2 mol %; and

BaO can be 0.5 to 8 mol %, 0.9 to 6 mol %, or 2.5 to 5 mol %, wherein the foregoing percentages are based on the total molar fraction of each component in the lead-free composition. Typically the lead-free composition is partially or fully glassy.

Other lead-free oxide compositions useful in the present paste composition are disclosed by US Patent Publication US2014/0261662 to Takeda et al., which is incorporated herein in its entirety for all purposes by reference thereto.

One such oxide is a lead-free, bismuth borosilicate glass frit comprising, 20 to 33 mole percent (mol. %) of bismuth oxide ($Bi_2O_3$), 25 to 40 mol. % of boron oxide ($B_2O_3$), 15 to 45 mol. % of zinc oxide (ZnO), and 0.5 to 9 mol. % of alkaline-earth metal oxide, alkali metal oxide or a mixture thereof, wherein the mol. % is based on the total molar fraction of each component in the glass frit.

Another such oxide is a lead-free, bismuth borosilicate glass frit comprising, 36 to 55 mole percent (mol. %) of bismuth oxide ($Bi_2O_3$), 29 to 52 mol. % of boron oxide ($B_2O_3$), 0 to 40 mol. % of zinc oxide (ZnO), 0.5 to 3 mol. % of silicon oxide ($SiO_2$), 0.5 to 3 mol. % of aluminum oxide ($Al_2O_3$), and 1 to 8 mol. % of alkaline-earth metal oxide, wherein the mol. % is based on the total molar fraction of each component in the glass frit.

Still other possible compositions include ones listed in Tables I and II of US2014/0261662, which is incorporated herein in the entirety for all purposes by reference thereto.

Alkali Metal Vanadium Oxide Composition

As used herein, the term "alkali metal vanadium oxide composition" refers to a composition containing cations of at least one alkali metal (nominally represented as "A," and including one or more of Li, Na, K, Rb, or Cs) and vanadium (V), and oxygen (O) anions that are all homogeneously mixed. In some embodiments, substantially all the anions are oxygen, while in others, up to 20% of the oxygen anions are replaced by halogen or other anions.

In an embodiment, the alkali metal vanadium oxide composition comprises A cations and V cations in respective cation percentages of "x" and "y", with a value of a ratio "z"=x/(x+y) that is between a lower limit and an upper limit, the lower limit being one of 0.3, 0.35, 0.4, 0.45, or 0.5, and the upper limit being one of 0.55, 0.6, and 0.65. In another embodiment, the alkali metal vanadium oxide composition may comprise A cations and V cations in respective cation percentages of "x" and "y", with a value of a sum "w"=(x+y) that is between a lower limit of 50, 60, 70, 80, 90, or 95 cation % and an upper limit of 100 cation %. In still another embodiment, the alkali metal vanadium oxide composition comprises A cations and V cations in respective cation percentages of "x" and "y", with a value of a sum "w"=(x+y) that is between a lower limit of 50, 60, 70, 80, 90, or 95 cation % and an upper limit of 100 cation % and a value of a ratio "z"=x/(x+y) that is between a lower limit and an upper limit, the lower limit being one of 0.3, 0.35, 0.4, 0.45, or 0.5, and the upper limit being one of 0.55, 0.6, and 0.65. In general, lowering the alkali metal:V cation ratio in the oxide component necessitates a higher total amount of that component in the paste composition, to obtain the same activity from the alkali metal cations. A higher V content generally lowers the melting or softening temperature of the oxide.

It is to be understood that in any of the foregoing embodiments, the alkali metal nominally designated "A" can be one of Li, Na, K, Rb, Cs, or a mixture thereof in any proportion, or one of K, Rb, Cs, or a mixture thereof in any proportion, or one of Rb, Cs, or a mixture thereof in any proportion, or substantially entirely Cs. In further embodiments, the alkali metal comprises at least 40%, 50%, 60%, 70%, 80% or 90% (by cation percentage) of one or both of Cs and Rb; or at least 40%, 50%, 60%, 70%, 80% or 90% of one or more of Cs, Rb, and K, with at most 50% being K (by cation percentages).

For example, an exemplary oxide composition useful in the present paste composition was made by melting together a physical mixture of powders of 38 wt. % $Cs_2CO_3$ and 62 wt. % $V_2O_5$. After the material was re-solidified, it was found by powder X-ray diffraction to be non-glassy and to contain about 32 wt. % crystalline $CsVO_3$ metavanadate and 68 wt. % crystalline $CsV_2O_{5.5}$, another possible cesium vanadium oxide compound. Since the Cs and V cations and the oxygen anions of this material were intimately chemically mixed during the melting operation, the re-solidified material is regarded as being a homogeneous, intimate mixture, even though it has a polycrystalline microstructure wherein grains of the two crystalline constituents are identifiably present, albeit intermingled.

The embodiments of the various oxide compositions described in the present specification, including the examples below, are not limiting; it is contemplated that one of ordinary skill in the art of glass chemistry could make minor substitutions of additional ingredients and not substantially change the desired properties of the oxide composition, including its interaction with a substrate and any insulating layer thereon. For example, substitutions of glass formers such as $P_2O_5$ 0-3, $GeO_2$ 0-3, $V_2O_5$ 0-3 in mol % can be used either individually or in combination to achieve similar performance for PbO, $SiO_2$ or $B_2O_3$. For example, one or more intermediate oxides, such as $TiO_2$, $Ta_2O_5$, $Nb_2O_5$, $ZrO_2$, $CeO_2$, and $SnO_2$ can be added to the glass composition.

Oxide Additive

The oxide component of the present paste composition optionally may further comprise a discrete oxide additive. It is contemplated that the additive may comprise a discrete oxide of one element or a discrete oxide of multiple elements. As used herein, the term "oxide of an element" includes both the oxide compound itself and any other organic or inorganic compound of the element, or the pure element itself if it oxidizes or decomposes on heating to form the pertinent oxide. Such compounds known to decompose upon heating include, but are not limited to, carbonates, nitrates, nitrites, hydroxides, acetates, formates, citrates, and soaps of the foregoing elements, and mixtures thereof. For example, Zn metal, zinc acetate, zinc carbonate, and zinc methoxide are potential additives that would oxidize or decompose to form zinc oxide upon firing. The oxide is discrete, in that it is not mixed at an atomic level with the fusible oxide composition, but is separately formulated and present in the paste composition. In an embodiment, the discrete oxide additive may be present in the paste composition in an amount ranging from 0.01 to 5 wt. %, or 0.05 to 2.5 wt. %, or 0.1 to 1 wt. %, based on the total weight of the paste composition. In various embodiments, a ratio of an aggregate amount of the discrete oxide to an amount of composition present in the first component ranges from 0 to 0.25, 0.33, 0.5, 0.75, 1, or 1.5 percent by weight.

In an embodiment, the first component of the present paste composition separately comprises at least one additional discrete oxide additive that is an oxide of one or more of B, Al, Li, Na, K, Rb, Cs, Mg, Ca, Sr, Ba, Ti, V, Mn, Fe, Co, Ni, Cu, Zn, Zr, Nb, Te, Si, Mo, Hf, Ta, W, Pb, Ag, Ga, Ge, In, Sn, Sb, Se, Ru, Bi, P, Y, La or the other lanthanide elements, mixtures thereof, or a substance which forms such an oxide upon firing.

In other embodiments, the discrete oxide additive is an oxide of one or more of Al, Li, Na, K, Rb, Cs, Ba, Ti, Zn, Zr, or Ru. Examples of such additives include, without limitation, lithium ruthenium oxides, as set forth in U.S. Pat. No. 8,808,581 to VerNooy et al., which is incorporated herein by reference thereto for all purposes. Particles of the oxide or non-oxide additives of any size can be employed, as long as they can be incorporated into the present paste composition and provide its required functionality.

The same size reduction techniques useful for particles of the first oxide component may also be used, if needed, to adjust the particle size of the oxide additive.

Although in some embodiments the present paste composition (including the oxide and non-oxide materials contained therein) may contain a substantial amount of lead, lead oxide, or other lead compound (e.g., in the oxide component), other embodiments are lead-free. As used herein, the term "lead-free paste composition" refers to a paste composition to which no lead has been specifically added (either as elemental lead or as a lead-containing alloy, compound, or other like substance), and in which the amount of lead present as a trace component or impurity is 1000 parts per million (ppm) or less by weight. In some embodiments, the amount of lead present as a trace component or impurity is less than 500 ppm, or less than 300 ppm, or less than 100 ppm. Surprisingly and unexpectedly, photovoltaic cells exhibiting desirable electrical properties, such as high conversion efficiency, are obtained using some embodiments of the paste composition and process of the present disclosure, notwithstanding previous belief in the art that substantial amounts of lead must be included in a paste composition to attain these end-use benefits.

Similarly, some embodiments of the present paste composition may comprise cadmium, e.g., in the oxide component, while others are cadmium-free, again meaning that no Cd metal or compound is specifically added and that the amount present as a trace impurity is less than 1000 ppm, 500 ppm, 300 ppm, or 100 ppm by weight.

Embodiments of the present paste include ones in which the first oxide component is present in an amount between a first lower limit and a first upper limit, the first lower limit being one of 0.1%, 0.25%, 0.5%, 1%, 1.5%, and 2%, and the first upper limit being one of 2.5%, 3%, 3.5%, 4%, 5%, 7.5%, 10%, or 12%, the amounts being measured by weight percentage of the paste composition.

In another alternative, the first oxide component of the present paste composition may comprise a plurality of separate fusible substances, such as one or more frits, a substantially crystalline material with additional frit material, or a plurality of crystalline materials, such that during a firing operation, the materials melt and become intimately mixed. In an embodiment, a first fusible subcomponent is chosen for its capability to rapidly etch an insulating layer, such as that typically present on one or both surfaces of a photovoltaic cell; further, the first fusible subcomponent may have strong etching power and low viscosity. A second fusible subcomponent is optionally included to slowly blend with the first fusible subcomponent to alter the chemical activity. Preferably, the composition is such that the insulating layer is partially removed but without attacking the underlying emitter-diffused region, which would shunt the device, were the corrosive action to proceed unchecked. Such fusible materials may be characterized as having a viscosity sufficiently high to provide a stable manufacturing window to remove insulating layers without damage to the diffused p-n junction region of a semiconductor substrate. Ideally, the firing process results in a substantially complete removal of the insulating layer without further combination with the underlying Si substrate or the formation of substantial amounts of non-conducting or poorly conducting inclusions.

C. Non Oxide, Magnesium-Containing Component

Embodiments of the present paste composition include a second, non-oxide, magnesium-containing component. For example, the second component may comprise, without limitation, elemental Mg (i.e., Mg metal) or an Mg silicide such as $Mg_2Si$, or a mixture thereof. It is to be understood that the magnesium-containing component may exhibit physical properties ordinarily regarded as metallic, including, inter alia, metallic electrical conductivity. Second component materials may also be semi-metallic, semiconducting, or non-conducting.

The inclusion of the Mg-containing component may permit electrodes fabricated on regions of Si wafers with p-type doping (e.g., B-doped regions) to exhibit good electrical contact without the presence of Al metal, which has heretofore been regarded as essential.

Eliminating aluminum may, in turn, prevent the formation of alumina inclusions in the conductive lines during firing that lead to increased line resistance. Alumina may also become dissolved in the oxide composition, deleteriously increasing its melting point. The presence of aluminum in some instances can lead to emitter damage, degrading electrical performance.

In various embodiments, the non-oxide, magnesium-containing second component is present in an amount ranging from a second lower limit to a second upper limit, the second lower limit being one of 0.05%, 0.1%, 0.2%, or 0.5%, and the second upper limit being one of 1%, 1.5%, 2%, 2.5%, 3%, 4%, 5%, or 7.5%, the amount being measured by weight percentage of the paste composition.

II. Organic Vehicle

The inorganic components of the present composition are typically mixed with an organic vehicle to form a relatively viscous material referred to as a "paste" or an "ink" that has a consistency and rheology that render it suitable for printing processes, including without limitation screen printing. The mixing is typically done with a mechanical system, and the constituents may be combined in any order, as long as they are uniformly dispersed and the final formulation has characteristics such that it can be successfully applied during end use.

A wide variety of inert materials can optionally be admixed in an organic medium in the present composition including, without limitation, an inert, non-aqueous liquid that optionally contains thickeners, binders, and/or stabilizers. By "inert" is meant a material that may be removed by a firing operation without leaving any substantial residue and that has no other effects detrimental to the paste or the final conductor line properties.

The proportions of organic vehicle and inorganic components in the present paste composition can vary in accordance with the method of applying the paste and the kind of organic vehicle used. In an embodiment, the present paste composition typically contains about 50 to 95 wt. %, 76 to 95 wt. %, or 85 to 95 wt. %, of the inorganic components and about 5 to 50 wt. %, 5 to 24 wt. %, or 5 to 15 wt. %, of the organic vehicle.

The organic vehicle typically provides a medium in which the inorganic components are dispersible with a good degree of stability of the chemical and functional properties of the paste composition. In particular, the composition preferably has a stability compatible not only with the requisite manufacturing, shipping, and storage, but also with conditions encountered during deposition, e.g., by a screen printing process. It is believed that in some embodiments, the inclusion of the additives provided herein enhances the stability of the present paste composition, e.g., against undesirable moisture pickup. Ideally, the rheological properties of the vehicle are such that it lends good application properties to the composition, including stable and uniform dispersion of solids, appropriate viscosity and thixotropy for printing, appropriate wettability of the paste solids and the substrate on which printing will occur, a rapid drying rate after deposition, and stable firing properties.

Substances useful in the formulation of the organic vehicle of the present paste composition include, without limitation, any one or more of the substances disclosed in U.S. Pat. No. 7,494,607 and International Patent Application Publication No. WO 2010/123967 A2, both of which are incorporated herein in their entirety for all purposes, by reference thereto. The disclosed substances include ethyl cellulose, ethylhydroxyethyl cellulose, wood rosin and derivatives thereof, mixtures of ethyl cellulose and phenolic resins, cellulose acetate, cellulose acetate butyrate, polymethacrylates of lower alcohols, monoalkyl ethers of ethylene glycol, monoacetate ester alcohols, and terpenes such as alpha- or beta-terpineol or mixtures thereof with other solvents such as kerosene, dibutylphthalate, butyl carbitol, butyl carbitol acetate, hexylene glycol, and high-boiling alcohols and alcohol esters. The organic vehicle may also include naturally-derived ingredients such as various plant-derived oils, saps, resins, or gums. Any of the polymers above or other suitable polymers may be present in the organic vehicle in any effective amount including, without limitation, an amount in the range of 0.1 wt. % to 5 wt. % of the total paste composition.

A preferred ester alcohol is the monoisobutyrate of 2,2,4-trimethyl-1,3-pentanediol, which is available commercially from Eastman Chemical (Kingsport, Tenn.) as TEXANOL™. Some embodiments may also incorporate volatile liquids in the organic vehicle to promote rapid hardening after application on the substrate. Various combinations of these and other solvents are formulated to provide the desired viscosity and volatility. The present paste composition may be adjusted as needed to obtain a predetermined, screen-printable viscosity, e.g., by adding additional solvent(s).

In an embodiment, the organic vehicle may include one or more components selected from the group consisting of: bis(2-(2butoxyethoxy)ethyl) adipate, dibasic esters, octyl epoxy tallate, isotetradecanol, and a pentaerythritol ester of hydrogenated rosin. The paste compositions may also include additional additives or components.

The dibasic ester useful in the present paste composition may comprise one or more dimethyl esters selected from the group consisting of dimethyl ester of adipic acid, dimethyl ester of glutaric acid, and dimethyl ester of succinic acid. Various forms of such materials containing different proportions of the dimethyl esters are available under the DBE® trade name from Invista (Wilmington, Del.). For the present paste composition, a preferred version is sold as DBE-3 and is said by the manufacturer to contain 85 to 95 weight percent dimethyl adipate, 5 to 15 weight percent dimethyl glutarate, and 0 to 1.0 weight percent dimethyl succinate based on total weight of dibasic ester.

Further ingredients optionally may be incorporated in the organic vehicle, such as thickeners, stabilizers, and/or other common additives known to those skilled in the art. The organic vehicle may be a solution of one or more polymers in a solvent. Additionally, effective amounts of additives, such as surfactants or wetting agents, may be a part of the organic vehicle. Such added surfactant may be included in the organic vehicle in addition to any surfactant included as a coating on the conductive metal powder of the paste composition. Suitable wetting agents include phosphate esters and soya lecithin. Both inorganic and organic thixotropes may also be present.

Among the commonly used organic thixotropic agents are hydrogenated castor oil and derivatives thereof, but other suitable agents may be used instead of, or in addition to, these substances. It is, of course, not always necessary to incorporate a thixotropic agent since the solvent and resin properties coupled with the shear thinning inherent in any suspension may alone be suitable in this regard.

III. Formation of Conductive Structures

A. Substrate

An aspect of the disclosure provides a process that may be used to form a conductive structure on a substrate. Ordinarily, the process first entails the fabrication of a precursor structure of any desired configuration, generally comprising the steps of providing the substrate and applying a paste composition onto it in a suitable pattern. Then the applied paste composition and the substrate are fired to produce the conductive structure, which is often termed a "metallization." Most commonly, the substrate is planar and relatively thin, thus defining opposing first and second major surfaces on its respective sides. The present paste composition may be used to form an electrode on one or both of these major surfaces.

B. Insulating Layer

In some embodiments, the present paste composition is used in conjunction with a substrate, such as a semiconductor substrate, having an insulating or passivation layer present on one or more of the substrate's major surfaces. The layer may comprise, without limitation, one or more components selected from aluminum oxide, titanium oxide, silicon nitride, $SiN_x$:H (silicon nitride containing hydrogen for passivation during subsequent firing processing), silicon oxide, and silicon oxide/titanium oxide, and may be in the form of a single, homogeneous layer or multiple sequential sub-layers of any of these materials. Silicon nitride and $SiN_x$:H are widely used. Passivation layers between 1 and 200 nm thick are suitable for typical applications.

In implementations for fabricating photovoltaic cells, the substrate ordinarily includes an insulating layer structured to provide an anti-reflective property, to lower the amount of incident light that is reflected from the cell's surface. Reducing the amount of light lost to reflection improves the cell's utilization of the incident light and increases the electrical current it can generate. Thus, the insulating layer is often denoted as an anti-reflective coating (ARC). The thickness of the layer preferably is chosen to maximize the anti-reflective property in accordance with the layer material's composition and refractive index. For example, the insulating ARC layer may have a thickness of between 1 and 200 nm. In one approach, the deposition processing conditions are adjusted to vary the stoichiometry of the layer, thereby altering properties such as the refractive index to a desired value. For a silicon nitride layer with a refractive index of about 1.9 to 2.0, a thickness of about 700 to 900 Å (70 to 90 nm) is suitable.

The insulating layer may be deposited on the substrate by methods known in the microelectronics art, such as any form of chemical vapor deposition (CVD) including plasma-enhanced CVD (PECVD) and thermal CVD, thermal oxidation, or sputtering. In another embodiment, the substrate is coated with a liquid material that under thermal treatment decomposes or reacts with the substrate to form the insulating layer. In still another embodiment, the substrate is thermally treated in the presence of an oxygen- or nitrogen-containing atmosphere to form an insulating layer. Alternatively, no insulating layer is specifically applied to the substrate, but a naturally forming substance, such as silicon oxide on a silicon wafer, may function as an insulating layer.

The present method optionally includes the step of forming the insulating layer on the semiconductor substrate prior to the application of the paste composition.

In some implementations of the present process, the paste composition is useful whether the insulating layer is specifically applied or naturally occurring. The paste's oxide and non-oxide components may act in concert to combine with, dissolve, or otherwise penetrate some or all of the thickness of any insulating layer material during firing.

C. Application

The present composition can be applied as a paste onto a preselected portion of either major surface of the substrate in a variety of different configurations or patterns, depending on the device architecture and the particular substrate material used. The preselected portion may comprise any fraction of the total area of either of the major surfaces. The area covered may range from a small fraction up to substantially all of the area. In an embodiment, the paste is applied on a semiconductor substrate, which may be single-crystal, cast mono, multi-crystal, polycrystalline, or ribbon silicon, or any other semiconductor material.

The application can be accomplished by a variety of deposition processes, including screen printing and other exemplary deposition processes discussed above. In an embodiment, the paste composition may be applied over any insulating layer present on the pertinent major surface of the substrate.

The conductive composition may be printed in any useful pattern. For example, the application of the conductive paste may be used to form a photovoltaic cell precursor, wherein the paste is deposited on a preselected portion of a semiconductor substrate in a configuration that is appointed to be formed by a firing operation into an electrically conductive structure that includes at least one electrode in electrical contact with the substrate. In an implementation, the at least one electrode is configured to be connected to outside electrical circuitry to which electrical energy is to be supplied.

The electrode pattern used for a front side electrode of a photovoltaic cell commonly includes a plurality of narrow grid lines or fingers connected to one or more larger bus bars. Such a pattern permits the generated current to be extracted from the front side without undue resistive loss, while minimizing the area obscured by the metallization, which inherently reduces the amount of incoming light energy that can be converted to electrical energy. Ideally, the features of the electrode pattern should be well defined, with a preselected thickness and shape, and have high electrical conductivity and low contact resistance with the underlying structure. Fingers that are uniform and have a high ratio of height to width are beneficial in increasing the effective conductor cross sectional area (thus decreasing electrical resistance) while minimizing the obscured area. In an embodiment, the width of the lines of the conductive fingers may be 20 to 200 µm; 25 to 100 µm; or 35 to 75 µm. In an embodiment, the thickness of the lines of the conductive fingers may be 5 to 50 µm; 10 to 35 µm; or 15 to 30 µm.

Various embodiments of the present process are adapted to produce a photovoltaic cell precursor that comprises electrically separate first and second electrodes. For example, the preselected portion of the substrate may comprise separate first and second subportions located on the first major surface. The paste composition is applied to both the first and second subportions in an arrangement configured to be formed by the firing operation into the electrically conductive structure comprising the first and second electrodes in electrical contact with the first and second subportions, respectively. In an implementation, the first and second subportions consist essentially of p-type and n-type semiconductor material, respectively.

Another possible photovoltaic cell precursor configuration provides an electrically conductive structure comprising electrically separate first and second electrodes respectively located on the first and second major surfaces. The paste composition is applied onto preselected portions of the first and second major surfaces in an arrangement configured to be formed by the firing operation into the electrically conductive structure, with the first and second electrodes being in electrical contact with the preselected portions of the first and second major surfaces, respectively. In an implementation, the preselected portions of the first and second major surfaces consist essentially of p-type and n-type semiconductor material, respectively.

Any of the foregoing photovoltaic cell precursors can be fabricated into photovoltaic cell devices by the firing operation and resulting conversion of the deposited paste composition into a suitably configured conductive structure that provides electrodes in electrical communication with the semiconductor. It is to be understood that this firing operation ordinarily permits the electrode to penetrate any insulative layer on either or both major surfaces of the original substrate.

Photovoltaic architectures wherein no light is received on the back side can employ a back side electrode that provides one of the polarities and covers most or all that major surface. However, conductive structures with bus bar and finger configuration similar to that used as a front-side electrode can sometimes be employed on the back surface as well. Since there is no incident light that can be lost to shadowing, the dimensions of conductors in back side electrodes are generally not restricted by efficiency considerations. For example, wider conductive fingers may be used, and are in some instances beneficial in reducing the effective resistance of the back side electrode structure.

In still other architectures, a photovoltaic cell precursor may be configured to permit formation of electrodes of both polarities on the back surface, so that no light is lost because of front side obscuration. One such structure is the so-called "interdigitated back contact" or "IBC" configuration. US Patent Publication US2008-0230119, which is incorporated herein in its entirety for all purposes by reference thereto, discloses one possible form of an IBC configuration that is illustrated by its FIG. 1B. In some possible implementations of an IBC architecture, a silicon wafer is provided with alternating finger-like regions of n-type and p-type material located on the back surface. These regions can be prepared by a number of techniques wherein requisite dopants are provided on a wafer surface and allowed to diffuse (usually at elevated temperature) into the bulk of the wafer to form the respective regions of n-type and p-type material. The regions can be defined by processes such as printing or photolithography, with the dopants provided in liquid or gaseous form or by ion implantation or the like. Other methods for producing IBC cells are provided by U.S. Pat. No. 9,048,374 to Scardera et al., which is also incorporated herein in its entirety for all purposes by reference thereto.

Conductors formed by printing and firing a paste such as that provided herein are often denominated as "thick-film" conductors, since they are ordinarily substantially thicker than traces formed by atomistic processes, such as those used in fabricating integrated circuits. For example, thick-film conductors may have a thickness after firing of about 1 to 100 µm. Consequently, paste compositions that in their processed form provide conductivity and are suitably applied using printing processes are often called "thick-film pastes" or "conductive inks."

D. Firing

A heat treatment operation often termed "firing" may be used in the present process to promote the formation of a conductive structure that includes an electrode providing a high-quality electrical contact with an underlying substrate, such as a semiconductor wafer in a PV (photovoltaic) cell. A drying operation optionally precedes the firing operation, and is carried out at a modest temperature to harden the paste composition by removing its most volatile organics.

The firing operation is believed to effect a substantially complete burnout of the organic vehicle from the deposited paste by volatilization and/or pyrolysis of the organic materials. While the present invention is not limited by any particular theory of operation, it is believed that during firing, constituents of the paste composition act to efficiently penetrate the insulating layer normally present on the wafer, such as a naturally-occurring or intentionally formed passivation layer and/or an antireflective coating. Such a result is frequently termed "fire-through." The various oxide and additive components are also thought to promote sintering of the conductive metal powder, e.g. silver, that forms the electrode.

Ideally, the firing results in formation of an electrode that has good electrical properties, including a high bulk conductivity and a low resistance connection to the underlying semiconductor material, thereby reducing the source impedance of the cell. It is also beneficial for the conductive metal structure to be mechanically robust and securely attached to the substrate, with a metallurgical bond being formed over substantially all the area of the substrate covered by the conductive element.

In an embodiment, the conductive metal is separated from the silicon by a nanometer-scale interfacial film layer (typically of order 5 nm or less) through which the photoelectrons tunnel. In another embodiment, contact is made directly between the conductive metal and the silicon or by a combination of direct metal-to-silicon contact and tunneling through thin interfacial film layers.

The firing typically comprises heating the deposited paste composition and the underlying substrate for a time and at a temperature sufficient for the formation of the conductive structure, including the electrode provided thereby. In one embodiment, the temperature for the firing may be in the range between about 300° C. and about 1000° C., or about 300° C. and about 850° C., or about 400° C. and about 750° C., or about 550° C. and about 750° C. The firing may be conducted using any suitable heat source, and may be performed in an atmosphere composed of air, nitrogen, an inert gas, or an oxygen-containing mixture such as a mixed gas of oxygen and nitrogen. In an embodiment, the firing is accomplished by passing the substrate bearing the printed paste composition pattern through a belt furnace at high transport rates, for example between about 100 to about 500 cm per minute, with resulting hold-up times between about 0.05 to about 5 minutes. Multiple temperature zones may be used to control the desired thermal profile in the furnace, and the number of zones may vary, for example, between 3 to 11 zones. The temperature of a firing operation conducted using a belt furnace is conventionally specified by the furnace set point in the hottest zone of the furnace, but it is known that the peak temperature attained by the passing substrate in such a process is somewhat lower than the highest set point. Other batch and continuous rapid fire furnace designs known to one of skill in the art are also contemplated.

In various process embodiments, the paste composition is applied to a preselected portion of the substrate that consists of, or consists essentially of, either n-doped or p-doped semiconducting material. The skilled person will recognize that, ideally, confining the metallization to material that is entirely of the desired conductivity type precludes electrical shunting, but that some overlap onto undoped regions of a substrate will not appreciably degrade the electrical quality of the connection, as long as the metallization does not bridge from an n-doped region to a p-doped region.

The present paste composition is readily used to fabricate electrodes that contact regions of a planar semiconductor surface that are doped to render them either n-type or p-type. For example, the composition may be used to contact the p-type emitter region of an n-type base cell or a p-type base region. The composition may be used to contact n-type regions, provided the semiconductor does not include a p-n junction that is shunted by the fabrication.

The preselected portion is ordinarily, but not required to be, on a major surface of a thin semiconductor wafer. A conductive structure, such as an electrode, is formed on the substrate by depositing and firing the paste, whereby the conductive structure is prepared and configured to be connected to an external electric load for the transfer of conduction electrons to or from the semiconductor, so that the semiconductor device can function in its intended manner as a circuit element. For example, a photovoltaic cell thus functions as an energy source by converting incident light into electrical energy that can do useful work.

In many conventional photovoltaic cell architectures, the n-doped and p-doped regions are located on opposite major sides of a thin semiconductor wafer. Frequently, the doped regions comprise all, or nearly all, the area of the respective major surfaces.

E. Semiconductor Device Manufacture

An embodiment of the present disclosure relates to a device structure comprising a substrate and a conductive electrode, which may be formed by the process described above.

Conductive structures as provided herein may be usefully employed in a wide range of electrical, electronic, and semiconductor devices. Without limitation, such devices include photodiodes, photovoltaic cells, and solar panels or other like articles, in which one or more conductive structures function as electrodes through which the device can be connected to other electrical circuitry. Devices that are individually or collectively fabricated using processes disclosed herein may be incorporated into larger structures, such as a solar panel including a plurality of interconnected photovoltaic cells.

Ideally, a paste composition would enable screen-printed crystalline silicon solar cells to have reduced saturation current density at the front surface (J0e) and accompanying increased Voc and Jsc, and therefore improved solar cell performance. Other desirable characteristics of a paste would include high bulk conductivity, low contact resistance, and the ability to form narrow, high-aspect-ratio contact lines in a metallization pattern to further reduce series resistance and minimize shading of incident light by the electrodes, as well as good adherence to the substrate.

One possible sequence of steps implementing the present process for manufacture of an n-type base photovoltaic cell device is depicted by FIGS. 1A-1F, which represent various steps in the preparation of a photovoltaic cell having bus bar/finger electrodes on both major surfaces.

FIG. 1A shows a part of an n-type base (or simply, "n-base") Si semiconductor substrate 110 with a p-type emitter 120. N-base substrate 110 can be formed by slicing a Si wafer from a starting ingot and doping it with a donor impurity such as P. The doping can be done either during ingot production or after the slicing operation. The p-type emitter 120 can be formed, for example, by thermal diffusion of an acceptor dopant into the sliced Si wafer. For example, the acceptor dopant can be provided from a boron compound such as boron tribromide ($BBr_3$). The thickness of the p-type emitter can be, for example, 0.1 to 10% of the N-type base semiconductor substrate thickness, or about 0.3 to 0.5 μm. In an embodiment, the depth of the diffusion layer can be varied by controlling the diffusion temperature and time.

Figure 1B:
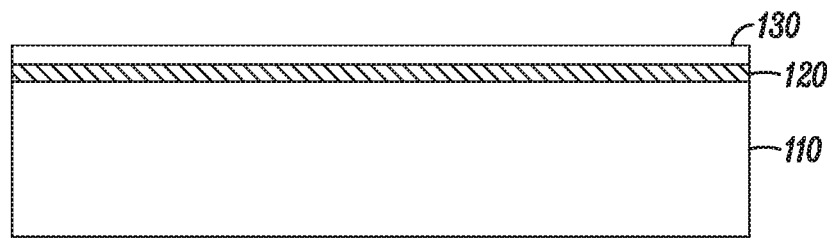

As shown in FIG. 1B, a passivation layer 130a can be formed on the p-type emitter 120. The passivation layer can comprise any suitable material including, without limitation, silicon nitride, $SiN_x$:H, silicon carbide (SiCx), titanium oxide ($TiO_2$), aluminum oxide ($Al_2O_3$), silicon oxide (SiOx), indium tin oxide (ITO), or a mixture thereof. The passivation layer can be formed by, for example, plasma enhanced chemical vapor deposition (PECVD) of these materials. In operation of a photovoltaic cell with the configuration shown, sunlight is incident on passivation layer 130a, which thus functions as an anti-reflective coating (ARC) as explained above. Layer 130a also acts to reduce carrier recombination, and can be in the form of a single layer or multiple layers of the same or different materials.

In an embodiment, the thickness of layer 130a is chosen to maximize the anti-reflective property in accordance with the material's composition and refractive index. For example, the insulating ARC layer may have a thickness of between 1 and 200 nm. In one approach, the deposition processing conditions are adjusted to vary the stoichiometry of the layer, thereby altering properties such as the refractive index to a desired value. For a silicon nitride layer with a refractive index of about 1.9 to 2.0, a thickness of about 700 to 900 Å (70 to 90 nm) is suitable.

Figure 1C:
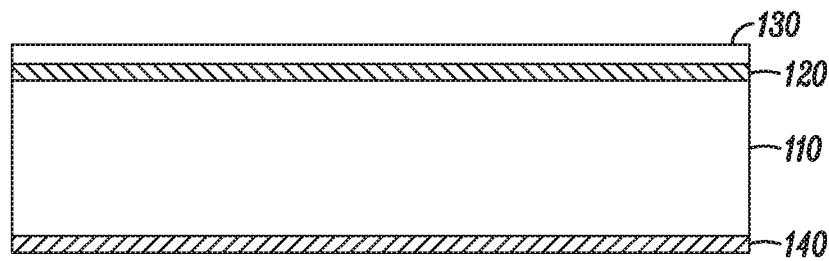

In an embodiment, as shown in FIG. 1C, an $n^+$-layer 140 is optionally formed on the major surface of substrate 110 opposite p-type emitter 120. If present, the $n^+$-layer 140 contains the donor impurity with a higher concentration than in the bulk of n-base substrate 110. For example, the $n^+$-layer 140 can be formed by thermal diffusion of phosphorus in the case of a silicon semiconductor. Inclusion of $n^+$-layer 140 is believed to reduce the recombination of electrons and holes at the interface between n-base layer 110 and $n^+$-layer 140.

Figure 1D:
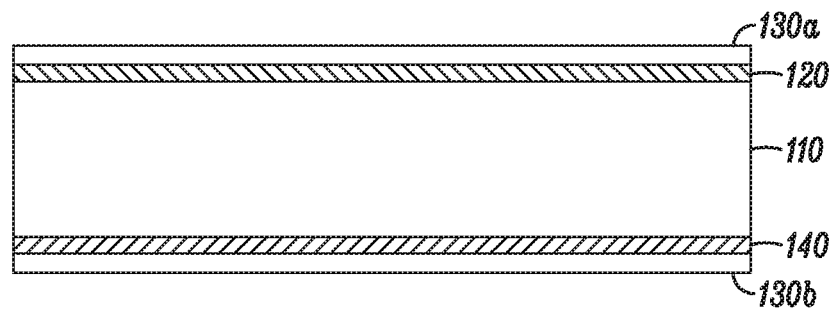

As shown in FIG. 1D, a passivation layer 130b is formed on $n^+$-layer 140 using the same materials and techniques employed for passivation layer 130a. Alternatively, different materials and/or processing may be used.

Figure 1E:
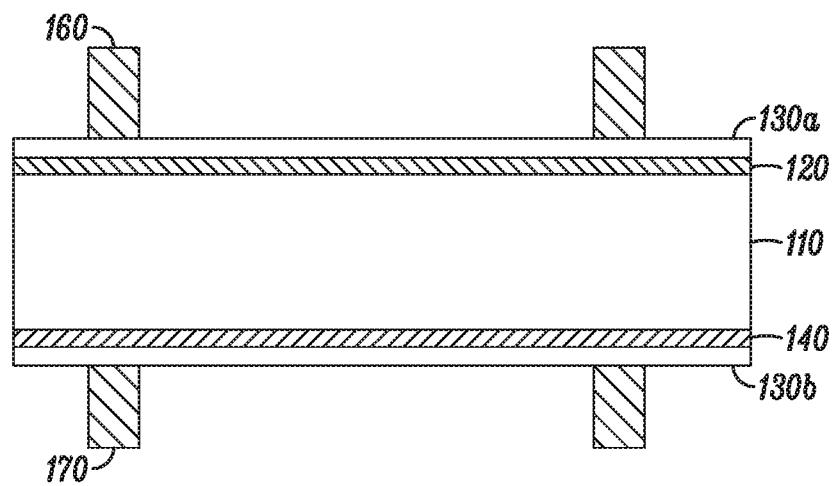
Figure 1F:
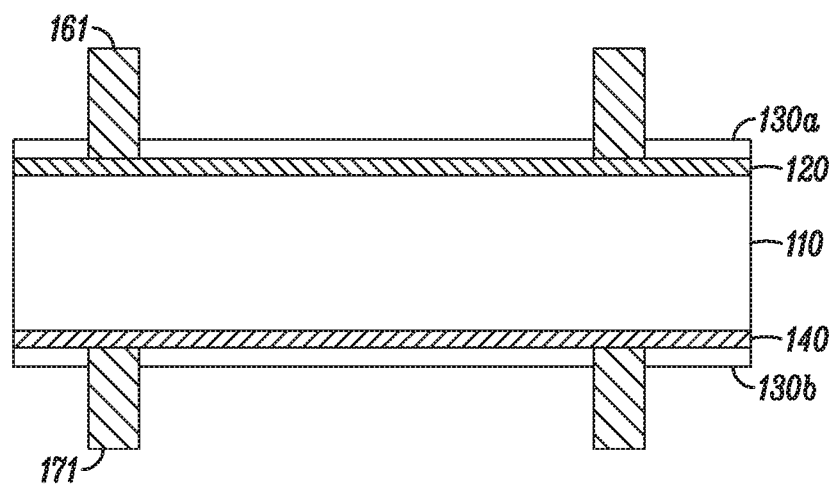

As shown in FIG. 1E, conductive paste 160 for forming a p-type electrode is applied onto the passivation layer 130a on the p-type emitter 120. A conductive paste 170 for forming an n-type electrode is applied onto the passivation layer 130b on $n^+$-layer 140. Both conductive pastes are typically applied by screen printing techniques.

In an embodiment, the conductive paste 170 on the $n^+$-base layer 140 is different in composition from the conductive paste 160 on the p-type emitter 120. The composition of the conductive paste 170 can be adjusted depending on, for example, the material or thickness of the passivation layer.

After deposition, conductive pastes 160 and 170 are optionally dried, e.g., for 10 seconds to 10 minutes at 150° C.

Thereafter, the structure and the deposited conductive pastes are fired. As shown FIG. 1F, the conductive pastes 160 and 170 penetrate, or fire through, their respective passivation layers 130a, 130b so that p-type electrode 161 and n-type electrode 171 are formed and make electrical connections with p-type emitter 120 and $n^+$-layer 140 respectively. Low resistance connections between these electrodes and the underlying semiconductor are needed for efficient extraction of electrical energy from the photovoltaic cell. Ideally, the attachment of the electrodes is also tenacious and mechanically robust.

A semiconductor device fabricated as described above may be incorporated into a photovoltaic cell. In another embodiment, a photovoltaic cell array includes a plurality of the aforementioned semiconductor devices as described. The devices of the array may be made using a process described herein.

It will be apparent that similar processes can be used to fabricate conductive structures in photovoltaic cells having other architectures or other electrical, electronic, and semiconductor devices, all of which are contemplated within the scope of the present disclosure.

EXAMPLES

The operation and effects of certain embodiments of the present invention may be more fully appreciated from a series of examples (Examples 1-16 and Comparative Examples 1-6) described below. The embodiments on which these examples are based are representative only, and the selection of those embodiments to illustrate aspects of the invention does not indicate that materials, components, reactants, conditions, techniques and/or configurations not described in the examples are not suitable for use herein, or that subject matter not described in the examples is excluded from the scope of the appended claims and equivalents thereof.

Oxide Component Preparation

The fusible oxide components used in the present conductive paste can be prepared using any suitable technique, including ones generally employed in the glass-making arts. Generally stated, the oxides used in the following paste preparations can be prepared as follows. First, the requisite solid oxides or other suitable precursors (e.g., carbonates) are blended and then heated in a suitable crucible (e.g., Pt) and held at a temperature sufficient to melt the constituents together, and thereafter poured onto a stainless steel quench plate. Then the solidified mass is mechanically ground to coarse powder and finally comminuted to attain a desired small particle size, such as a do (measured using a Horiba LA-910 analyzer), of less than about 2-3 µm. For example, the coarse powder may be ball milled in a polyethylene container with zirconia media and isopropyl alcohol or water optionally containing 0.5 wt. % TRITON™ X-100 octylphenol ethoxylate surfactant (available from Dow Chemical Company, Midland, Mich.). The comminuted powder can be recovered by centrifugation or filtration and then dried.

Silver Powder

The Ag powder used in the exemplary paste compositions below was finely divided and represented by the manufacturer as having a predominantly spherical shape. Various lots of the material were determined to have a particle size distribution with a $d_{50}$ of about 1.8-2 µm (as measured in an isopropyl alcohol dispersion using a Horiba LA-910 analyzer).

Organic Vehicle

Generally stated, the paste compositions below were formulated by dispersing the constituent inorganic solids in an organic vehicle, which was prepared as a masterbatch using a planetary, centrifugal Thinky® mixer (available from Thinky® USA, Inc., Laguna Hills, Calif.) to mix the requisite ingredients. A suitable formulation is listed in Table I below, with percentages given by weight. TEXANOL™ ester alcohol solvent is available from Eastman Chemical Company, Kingsport, Tenn. A small percentage of the nominal solvent content is typically held back to permit later viscosity adjustment, as further described below.

TABLE I

| Organic Vehicle Composition | |
|---|---|
| Ingredient | wt. % |
| 11% ethyl cellulose (50-52% ethoxyl) dissolved in TEXANOL ™ solvent | 8.43% |
| 8% ethyl cellulose (48-50% ethoxyl) dissolved in TEXANOL ™ solvent | 8.43% |
| tallowpropylenediaminedioleate | 5.69% |
| pentaerythritol ester of hydrogenated rosin | 29.61% |

TABLE I-continued

| Organic Vehicle Composition | |
|---|---|
| Ingredient | wt. % |
| gum damar | 4.27% |
| hydrogenated castor oil derivative | 5.69% |
| dibasic ester | 29.61% |
| aromatic solvent | 1.42% |
| TEXANOL ™ solvent | (balance) |

Paste Preparation

A representative process for preparing the paste compositions herein entails combining the requisite amounts of the first, oxide component and Ag powder in a glass jar and tumble-mixing them for about 15 min. This mixture can be added by thirds to a jar containing organic vehicle from the aforementioned masterbatch and mixed after each addition using the aforementioned Thinky® mixer for 1 minute at 2000 RPM, whereby the ingredients are well dispersed in the organic vehicle.

After the final addition, the paste may be cooled and the viscosity adjusted to between about 300 and 400 Pa-s by adding solvent and Thinky mixing for 1 minute at 2000 RPM. The paste is then milled on a three-roll mill (Charles Ross and Son, Hauppauge, N.Y.) with a 25 µm gap for 3 passes at zero pressure and 3 passes at 100 psi (689 kPa).

The paste compositions then may be allowed to sit for at least 16 hours after roll milling, after which their viscosities are adjusted to ~300 Pa-s with additional TEXANOL™ solvent to render them suitable for screen printing. In accordance with conventional practice, provision is typically made for such a viscosity adjustment by holding back a small amount of the solvent (typically 2 to 3% by total weight) from the original formulation. In some instances, addition of the entire holdback is not required to attain the desired final viscosity. The viscometer may be a Brookfield viscometer (Brookfield Inc., Middleboro, Mass.) with a #14 spindle and a #6 cup. Viscosity values may be taken after 3 minutes at 10 RPM. Typically, a viscosity of about 300 Pa-s has been found to yield good screen printing results, but some variation, for example ±50 Pa-s or more, would be acceptable, depending on the precise printing parameters.

The foregoing process typically produces paste composition material that is sufficiently homogenous to achieve reproducible solar cell performance.

Unless otherwise stated, paste compositions described herein as comprising a magnesium-containing component along with the oxide component were prepared using one of two alternative protocols. For some compositions, a paste masterbatch containing the requisite conductive metal powder, the first, fusible oxide component, and the organic vehicle was first mixed and roll milled as described above. Thereafter, the additive was introduced into the paste masterbatch and another mixing operation was carried out in the Thinky® mixer for 3 cycles of 1-2 min. each, with a period of cooling between steps to assure the effectiveness of the mixing. Optionally, a reactive component such as magnesium metal is first dispersed in a suitable organic medium to reduce its interaction with atmospheric oxygen or moisture, and then combined with a masterbatch. For example, the reactive component may be dispersed in any of the organic liquids delineated above as useful in the present organic vehicle, for example at about 50-99% by weight in terpineol.

Alternatively, the Mg-containing additive substance (sieved to −325 mesh) might be dry-mixed with the first oxide composition and conductive metal powder. The combined inorganics are then mixed in aliquots with the organic vehicle in the aforementioned Thinky® mixer and thereafter roll milled, as described generally above. The viscosity of each finished paste after either mixing protocol is ordinarily adjusted as needed to a value suitable for screen printing by adding a small amount of TEXANOL™ solvent as set forth above.

Still other mixing protocols and orders of addition of the various ingredients are also contemplated, provided the resulting paste composition can be successfully used to fabricate good quality conductive structures.

Si Wafer Substrates

The examples herein illustrate the use of the present paste composition in preparing electrodes on both n- and p-doped regions.

N-type base cells were fabricated on monocrystalline Si substrates with a phosphorus-doped, n-type base and a relatively heavily boron-doped front layer that forms a surface p-type emitter region having a 70-75 Ω/sq. surface resistivity. The wafers were obtained from the International Solar Energy Research Center, Konstanz, Germany. A diffusion process was used to increase the P dopant level in a back surface layer to create a back surface field (BSF) and thereby reduce surface recombination and enhance cell efficiency. Both major surfaces had a conventionally applied $SiN_x$:H antireflective coating (ARC) and were textured to enhance light trapping, but with different texture topographies on the respective surfaces.

For convenience, the experiments were all carried out using ~28 mm×28 mm "cut down" wafers prepared by dicing large starting wafers (e.g. ~156 mm×156 mm square wafers, ~200 μm thick) with a diamond blade saw, unless otherwise indicated. Performance of such 28 mm×28 mm cells is known to be impacted by edge effects, which typically reduce the overall photovoltaic cell efficiency by as much as ~1 to 3% from what would be obtained with full-size wafers.

N-type silicon wafer substrates used to prepare cells with an interdigitated back contact (IBC) architecture were formed by localized, patterned doping of boron and phosphorus in the interdigitated regions. The equivalent emitter sheet resistance for the boron doped emitter region of the IBC cells was ~65 ohm/sq.

Conductive Paste Compositions

Back side electrodes of the exemplary n-type base photovoltaic cells below were prepared using suitable commercially available paste compositions. Unless otherwise indicated, back side electrodes were made using silver-containing SOLAMET® PV17F paste composition from E.I. du Pont de Nemours and Co., Wilmington, Del., to produce an electrode with a bus bar/finger configuration similar to the front-side configuration described below, but with slightly wider finger conductors.

Cell Fabrication

Generally stated, exemplary photovoltaic n-type cells were prepared using a process with steps schematically depicted in FIG. 1, as described above. Front side electrodes were formed by screen printing. The desired paste composition was deposited in a preselected pattern onto the emitter surface located on the front (light-receiving) major side of a thin silicon wafer, using an AMI-Presco (AMI, North Branch, N.J.) MSP-485 semi-automatic screen printer. The electrodes were formed in a comb-like pattern comprising 13 fingers (pitch ~0.20 cm) extending perpendicularly from a bus bar (hereinafter, "bus bar/finger" configuration). The back-side electrodes were made in a similar configuration, but with a printing screen that produced slightly wider finger conductors. A center pad was included to facilitate electrical testing of the finished cell.

After printing and drying, the cells were fired in a rapid thermal processing, multi-zone belt furnace (BTU International, North Billerica, Mass.). For each paste, multiple cells were printed, so that 3 cells could be fired at each chosen furnace peak set point temperature. It is understood that the peak temperature experienced by each cell during passage through the firing furnace in such a process is about 140 to 150° C. lower than the peak zone set point temperature. After firing, the median conductor line width for the front side electrodes was ~80-100 μm and the mean line height was ~10-15 μm. The bus bar was 1.25 mm wide. The median line resistivity was ~2.2-2.7 μΩ-cm. For back-side electrodes in the bus bar/finger configuration, the median line width for the finger conductors was ~210-220 μm.

Electrical Testing

Unless otherwise specified, electrical properties reported herein were measured using an ST-1000 IV tester (Telecom STV Co., Moscow, Russia). The Xe arc lamp in the IV tester simulates sunlight with a known intensity and irradiates the front surface of the cell. Tests herein were carried out on photovoltaic cells at 25±1.0° C. at a 1-Sun light intensity. The tester uses a four contact method to measure current (I) and voltage (V) at approximately 400 load resistance settings to determine the cell's I-V curve. Efficiency (Eff), fill factor (FF), and apparent series resistance ($R_a$) were obtained from the I-V curve for each cell. $R_a$ is defined in a conventional manner as the negative of the reciprocal of the local slope of the IV curve near the open circuit voltage. As recognized by a person of ordinary skill, $R_a$ is conveniently determined and a close approximation for $R_s$, the true series resistance of the cell. Open circuit voltage ($V_{oc}$) was measured in a conventional manner for some of the cells.

Tests were carried out after the firing of the photovoltaic cells. Mean or median electrical results are reported for the cell groups fired at the firing temperature indicated. For each furnace condition and run cycle, control cells were made with known commercial wafer samples and conductive pastes. The control cells were included in each firing and thereafter tested. The processing and electrical testing were assumed valid as long as the results for the control cells were within established limits. Of course, the foregoing protocols are exemplary and other equipment and procedures suitable for heat treating and testing efficiencies and other pertinent electrical properties will be recognized by one of ordinary skill in the art.

Example 1

Comparative Example 1

Effect of $Mg_2Si$ in Paste Composition

Example 1 demonstrates the beneficial effect of including $Mg_2Si$ in paste compositions comprising conductive silver powder and a lead borate-based frit to be used in making front-side electrodes on n-type photovoltaic cells.

A paste composition for Example 1 was prepared by combining 1.5 wt. % $Mg_2Si$ with a commercial, lead borate-based paste composition (SOLAMET® PV16A, available from E.I. Du Pont de Nemours and Company, Wilmington, Del.) in a Thinky® mixer. The $Mg_2Si$ used herein was obtained Alfa Aesar, Ward Hill, Mass. as a −20 mesh powder and sieved to −325 mesh before incorporation. The PV16A composition is ordinarily used for fabricating electrodes on the n-type, front-side emitter of P-base photovoltaic cells.

Using the paste compositions of Example 1 and unmodified PV16A (designated as Comparative Example 1), conductive structures comprising a bus bar and a plurality of conductive traces extending perpendicularly from it were prepared on the front surface of n-type Si photovoltaic cell wafers, as described above. Back side electrodes were prepared in a bus bar/finger configuration using SOLAMET® PV17F paste composition as also described above.

The wafers were then fired to form the front and back side electrodes. The fired wafers were electrically tested as described above.

TABLE I

Electrical Properties Of N-Type PV Cells With Front-Side Electrodes Made With Paste Compositions With And Without $Mg_2Si$ Additive

| Example | Base Paste | Additive | Eff. (%) | FF (%) | Ra (Ω) |
|---|---|---|---|---|---|
| Comp. Ex. 1 | PV16A | None | 2.5 | 30.5 | 5.89 |
| Ex. 1 | PV16A | 1.5 wt % $Mg_2Si$ | 16.4 | 69.95 | 0.22 |

It can be seen that adding $Mg_2Si$ to the paste composition used to prepare the front side electrodes of the exemplary n-type PV cells resulted in substantially improved electrical performance, as demonstrated by increased energy conversion efficiency and filling factor and decreased apparent series resistance. Without the $Mg_2Si$, a satisfactory contact to the p-doped emitter on the front side could not be established, so the cells of Comparative Example 1 did not exhibit high enough efficiency to be industrially viable.

Examples 2-3

Comparative Example 2

Effect of $Mg_2Si$ in Paste Composition

Examples 2-3 demonstrate the beneficial effect of including $Mg_2Si$ in paste compositions comprising conductive silver powder and a cesium vanadium oxide-based fusible material to be used in making front-side electrodes on n-type photovoltaic cells.

The fusible material for Examples 2-3 and Comparative Example 2 listed in Table II was prepared by melting together a mixture of $Cs_2CO_3$ (Alfa Aesar, Ward Hill, Mass.) and $V_2O_5$ (Aldrich, St. Louis, Mo.) in amounts that yielded a combined oxide with Cs and V content of 38 and 62 atomic percent, respectively. X-ray diffraction revealed that the resultant powder, hereinafter referred to as "Cs0.38V0.62Ox," was non-glassy, and comprised ~32 wt. % $CsVO_3$ (Cesium Metavanadate) and ~68 wt. % $CsV_2O_{5.5}$ (Cesium Vanadium Oxide) crystalline phases.

For the paste composition of Comparative Example 2, the desired amounts of Ag powder (86.2% by weight of the paste composition), the Cs0.38V0.62Ox oxide, and organic vehicle were Thinky-mixed together and roll milled. For Examples 2-3, the same composition was first prepared as a masterbatch. $Mg_2Si$ powder (Alfa Aesar, Ward Hill, Mass.) was sieved through a 325 mesh screen and then combined with the masterbatch by a Thinky mixing procedure.

TABLE II

Paste Compositions With Cs0.38V0.62Ox Fusible Material

| Example | wt % Cs0.38V0.62Ox (before additive) | wt. % $Mg_2Si$ additive |
|---|---|---|
| 2 | 1.8 | 1.2 |
| 3 | 1.0 | 1.0 |
| Comp. Ex. 2 | 2.0 | 0.0 |

N-type photovoltaic cells were fabricated using the pastes of Examples 2-3 and Comparative Example 2 to prepare front-side electrodes. DuPont SOLAMET® PV17F paste was used to form back-side electrodes with a similar bus bar/finger configuration. The cells were fired and electrically tested as described above, yielding the properties that are set forth in Table III.

TABLE III

Electrical Properties of N-Type Photovoltaic Cells

| Example | additive | Eff. (%) | FF (%) | Ra (Ω) |
|---|---|---|---|---|
| 2 | 1.2% $Mg_2Si$ | 16.0 | 69.1 | 0.221 |
| 3 | 1.0% $Mg_2Si$ | 16.2 | 69 | 0.230 |
| Comp. Ex. 2 | none | 2.2 | 27.1 | 7.21 |

It can be seen that adding $Mg_2Si$ to the cesium vanadium oxide-containing paste composition used to prepare the front side electrodes of the exemplary n-type PV cells resulted in substantially improved electrical performance, as demonstrated by increased energy conversion efficiency and filling factor and decreased apparent series resistance. Without the $Mg_2Si$, a satisfactory contact to the p-doped emitter on the front side could not be established, so the cells did not exhibit high enough efficiency to be industrially viable.

Examples 4-13

Comparative Example 3

Effect of Mg Metal in Paste Composition

Examples 4-13 demonstrate the beneficial effect of including Mg metal powder in paste compositions comprising conductive silver powder and lead borate-based frits to be used in making front-side electrodes on n-type photovoltaic cells.

The paste compositions of Examples 4a-13a were formulated with Ag powder (86.2% by weight of the paste composition) and the indicated amounts of two lead borate-based frits and Mg metal with two different particle sizes, dispersed in a conventional organic vehicle. The frits used had the compositions (cation %) shown in Table IV. The various oxides used to make the frit are available, e.g. from Alfa Aesar ($B_2O_3$), Aldrich (PbO, $SiO_2$), and ICN Alumina ($Al_2O_3$). $Li_2O$ can be supplied from $Li_2CO_3$ (Aldrich). Mg metal powder from Aldrich (designated as Type C) was sieved to −325 mesh. Mg metal powder from Magnesium Elektron, Tamaqua, Pa., (designated as Type D) comprised microparticles having a $d_{50}$ of 9.5 µm. Each of the paste compositions was first formulated as described above with all the ingredients except the Mg powder, which was added in a final step conducted in a Thinky® mixer. The resulting paste compositions are listed in Table V.

The paste composition of Comparative Example 3a was prepared with the same Ag and vehicle and frit type B, but without addition of any Mg metal.

TABLE IV

Lead Borate Frit Compositions

| Oxide | Frit Type A | Frit Type B |
|---|---|---|
| PbO | 45.20 | 27.8 |
| $B_2O_3$ | 50.30 | 60.9 |
| $SiO_2$ | 1.40 | — |
| $Al_2O_3$ | 3.10 | — |
| $Li_2O$ | — | 11.3 |

TABLE V

Paste Compositions With Lead Borate-based Frit and Mg Metal

| Example | Frit Type | Frit Amount (wt %) | Mg Type | Mg Amount (wt %) |
|---|---|---|---|---|
| 4a | A | 5.0 | C | 2.0 |
| 5a | A | 3.0 | C | 1.0 |
| 6a | A | 3.0 | C | 0.5 |
| 7a | A | 3.0 | C | 0.25 |
| 8a | B | 5.0 | D | 1.44 |
| 9a | B | 5.0 | D | 0.72 |
| 10a | B | 5.0 | D | 0.475 |
| 11a | B | 5.0 | D | 0.23 |
| 12a | B | 5.0 | D | 0.18 |
| 13a | B | 5.0 | D | 0.072 |
| Comp. Ex. 3a | B | 5.0 | — | — |

The paste compositions of Examples 4a-13a and Comparative Example 3a were used to prepare front-side electrodes for n-type photovoltaic cells. DuPont SOLAMET® PV17F paste was used to form back-side electrodes with a similar bus bar/finger configuration. Wafers made with each composition were fired in a belt furnace. After firing, the cells were tested using the equipment and procedures described above. For most of the compositions, firing was carried out with two different peak set point temperatures as indicated. The resulting electrical data are set forth in Table VI.

TABLE VI

Electrical Properties of N-Type Photovoltaic Cells

| Example | Mg Type | Mg Amount (wt %) | Firing (° C.) | Eff. (%) | FF (%) | Ra (Ω) | Voc (mV) |
|---|---|---|---|---|---|---|---|
| 4b | C | 2.0 | 895 | 15.2 | 71 | 0.219 | 580 |
| 4c | C | 2.0 | 900 | 15.25 | 67 | 0.281 | 601 |
| 5b | C | 1.0 | 895 | 16.24 | 71.9 | 0.198 | 617 |
| 6b | C | 0.5 | 895 | 16.48 | 72.6 | 0.189 | 610 |
| 7b | C | 0.25 | 895 | 16.33 | 71.7 | 0.216 | 621 |
| 8b | D | 1.44 | 895 | 15.7 | 70.2 | 0.205 | 589 |
| 8c | D | 1.44 | 870 | 15.5 | 69.4 | 0.221 | 590 |
| 9b | D | 0.72 | 895 | 16.47 | 71.3 | 0.185 | 604 |
| 9c | D | 0.72 | 870 | 16.51 | 70.9 | 0.196 | 608 |
| 10b | D | 0.475 | 880 | 16.17 | 70.5 | 0.206 | 614 |
| 10c | D | 0.475 | 865 | 16.29 | 71.4 | 0.189 | 604 |
| 11b | D | 0.23 | 890 | 16.44 | 71.3 | 0.196 | 616 |
| 11c | D | 0.23 | 855 | 16.22 | 70 | 0.180 | 619 |
| 12b | D | 0.18 | 880 | 16.27 | 70.2 | 0.225 | 624 |
| 12c | D | 0.18 | 865 | 16.25 | 71.9 | 0.195 | 617 |
| 13b | D | 0.072 | 880 | 15.77 | 67.6 | 0.244 | 622 |
| 13c | D | 0.072 | 865 | 15.7 | 68.8 | 0.238 | 615 |
| Comp. 3b | — | — | 880 | 0.91 | 28.8 | 15.8 | 645 |
| Comp. 3c | — | — | 865 | 0.54 | 30.5 | 26.5 | 628 |

It can be seen that adding Mg metal of either type to the paste compositions used to prepare the front side electrodes of the exemplary n-type PV cells resulted in substantially improved electrical performance, as demonstrated by increased energy conversion efficiency and filling factor and decreased apparent series resistance. Without the Mg, a satisfactory contact to the p-doped emitter on the front side could not be established, so the cells of Comparative Examples 3b and 3c did not exhibit high enough efficiency to be industrially viable.

Examples 14-15

Comparative Examples 4-5

Effect of $Mg_2Si$ in Paste Composition

Examples 14-15 demonstrate the beneficial effect of including $Mg_2Si$ in paste compositions comprising conductive silver powder and a lead-free, bismuth borosilicate-based frit to be used in making front-side electrodes on n-type photovoltaic cells. The frit composition is shown in Table VIII. The various oxides used to make the frit are available, e.g. from Alfa Aesar ($B_2O_3$), Aldrich ($SiO_2$, BaO, $Bi_2O_3$), US Zinc Corporation (ZnO), and ICN Alumina ($Al_2O_3$).

For the paste compositions of Comparative Examples 4-5 the desired amounts of Ag powder (86.2% by weight of the paste composition), the frit of Table VIII (at 8 or 4 wt. %), and organic vehicle were Thinky-mixed together and roll milled. For Examples 14-15, the same compositions were first prepared as masterbatches as shown in Table IX. $Mg_2Si$ powder (Aldrich, sieved through a 325 mesh screen) was then combined with the respective masterbatches by a Thinky mixing procedure.

TABLE VIII

Frit Composition

| oxide | cation % |
|---|---|
| $SiO_2$ | 4.1 |
| $Al_2O_3$ | 1.5 |
| $B_2O_3$ | 30.4 |
| ZnO | 21.4 |
| BaO | 2.2 |
| $Bi_2O_3$ | 40.5 |

N-type photovoltaic cells were fabricated using the pastes of Examples 14-15 and Comparative Examples 4-5 to prepare front-side electrodes. DuPont SOLAMET® PV17F paste was used to form back-side electrodes with a similar bus bar/finger configuration. The cells were fired and electrically tested as described above, yielding the properties that are set forth in Table IX.

TABLE IX

Electrical Properties Of N-Type PV Cells With
Front-Side Electrodes Made With Paste Compositions
With And Without Mg$_2$Si Additive

| Example | Frit Amount (wt %) | Mg$_2$Si Additive | Eff. (%) | FF (%) | Ra (Ω) |
|---|---|---|---|---|---|
| Ex. 14 | 8 | 1.7 wt % | 10.5 | 48.4 | 0.68 |
| Ex. 15 | 4 | 1.7 wt % | 13.9 | 62.6 | 0.37 |
| Comp. Ex. 4 | 8 | — | 2.5 | 33.8 | 3.06 |
| Comp. Ex. 5 | 4 | — | 11.3 | 49.7 | 0.60 |

It can be seen that adding Mg$_2$Si to both paste compositions resulted in improved electrical performance, as demonstrated by increased energy conversion efficiency and filling factor and decreased apparent series resistance. Without the Mg$_2$Si addition, the 8 wt % frit composition did not produce a satisfactory electrode, whereas addition of the Mg$_2$Si improved the efficiency. The 4 wt % frit composition also showed property improvements with incorporation of Mg$_2$Si, albeit smaller.

Example 16

Comparative Example 6

Fabrication of IBC Photovoltaic Cells Using
Mg$_2$Si-Containing Paste Composition Example 16 demonstrates the beneficial effect of including Mg metal in paste compositions comprising conductive silver powder and an alkali vanadium oxide-based fusible material to be used in making electrodes for interdigitated back contact photovoltaic cells.

The fusible material was prepared by melting together a mixture of K$_2$CO$_3$, Rb$_2$CO$_3$ and V$_2$O$_5$ (Aldrich) in amounts that yielded a combined oxide with {K,Rb} and V content of 50 and 50 atomic percent, respectively, and with an atomic ratio of Rb/K~1.33. Small amounts of SiO$_2$ (~0.8 cation %) and Al$_2$O$_3$ (~1.4 cation %) were included in the oxide material. This fusible material is hereinafter referred to as "{Rb,K}VO3".

Paste compositions listed in Table X were formulated as before using the {Rb,K}VO3" powder (~1.75 wt. %), Ag powder (~86.25 wt. %), and the organic vehicle described above. First, the composition of Comparative Example 6a (without the Mg$_2$Si additive) was prepared. Then, the composition of Example 16a was prepared by blending a portion of the Comparative Example 6a paste with ~0.2 wt. % of type D Mg powder (as used in Examples 8-13 above) using the Thinky® mixer.

TABLE X

Paste Compositions With {Rb, K}VO3 Fusible Material

| Example | wt % {Rb, K}VO3 (before additive) | wt. % Mg additive |
|---|---|---|
| Ex. 16a | 1.75 | 0.2 |
| Comp. Ex. 6a | 1.75 | 0.0 |

The paste compositions of Example 16a and Comparative Example 6a were used to fabricate electrodes contacting both n-doped and p-doped regions of n-type solar cells with an interdigitated back contact (IBC) architecture. Wafers for these cells having interdigitated n-type and p-type regions were prepared as Examples 16b and Comparative Example 6b in accordance with a method described at col. 5, line 48, to col. 8, line 26, of U.S. Pat. No. 9,048,374 and depicted in its FIGS. 4A-4M. Each composition was deposited onto both respective regions in a single screen printing step. The IBC cells were then fired in air using a belt furnace with the same temperature profile as in the preceding examples. The finished cells were then electrically tested for energy conversion efficiency under 1-Sun illumination as before. The results are summarized in Table XI.

TABLE XI

Interdigitated Back Contact Solar Cells Performance Using
Ag Pastes with {Rb, K}VO3 Fusible Material

| Example | Base Paste | Additive | Eff. (%) | FF (%) | Ra (Ω) |
|---|---|---|---|---|---|
| Ex. 16b | 1.75% {Rb, K}VO3 | 0.2 wt % Mg | 17.6 | 67% | 0.31 |
| Comp. Ex. 6b | 1.75% {Rb, K}VO3 | none | 0.73 | 25% | 53.8 |

It can be seen from Table XI that a small amount of metallic Mg additive resulted in a marked improvement in electrical properties, including increased energy conversion efficiency and decreased series resistance (Ra). Example 16 further demonstrates the ability of certain paste compositions to form high quality electrodes contacting both n-doped and p-doped regions of a Si semiconductor, with both electrodes being produced by a process comprising a single printing operation and a single firing operation.

Having thus described the invention in rather full detail, it will be understood that this detail need not be strictly adhered to but that further changes and modifications may suggest themselves to one skilled in the art, all falling within the scope of the invention as defined by the subjoined claims.

For example, a skilled person would recognize that the choice of raw materials could unintentionally include impurities that may be incorporated into the oxide composition or other paste constituents during processing. These incidental impurities may be present in the range of hundreds to thousands of parts per million. Impurities commonly occurring in industrial materials used herein are known to one of ordinary skill.

The presence of the impurities would not substantially alter the chemical and rheological properties of the oxide-based component, the oxide composition therein, paste compositions made with the oxide-based component, or the electrical properties of a fired device manufactured using the paste composition. For example, a solar cell employing a conductive structure made using the present paste composition may have the efficiency and other electrical properties described herein, even if the paste composition includes impurities.

Where a range of numerical values is recited or established herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value.

In this specification, unless explicitly stated otherwise or indicated to the contrary by the context of usage, where an embodiment of the subject matter hereof is stated or described as comprising, including, containing, having, being composed of, or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present. Additionally, the term "comprising" is intended to include examples encompassed by the terms "consisting essentially of" and "consisting of." Similarly, the term "consisting essentially of" is intended to include examples encompassed by the term "consisting of."

When an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

In this specification, unless explicitly stated otherwise or indicated to the contrary by the context of usage, amounts, sizes, ranges, formulations, parameters, and other quantities and characteristics recited herein, particularly when modified by the term "about," may but need not be exact, and may also be approximate and/or larger or smaller (as desired) than stated, reflecting tolerances, conversion factors, rounding off, measurement error, and the like, as well as the inclusion within a stated value of those values outside it that have, within the context of this invention, functional and/or operable equivalence to the stated value.

What is claimed is:

1. A paste composition, comprising:
   an inorganic solids portion that consists of:
   (a) a first oxide component,
   (b) a second component that is a magnesium silicide, and
   (c) a source of an electrically conductive metal consisting essentially of Ag, Au, Cu, Ni, Pd, Pt, or a mixture or alloy thereof; and
   an organic vehicle in which the constituents of the inorganic solids portion are dispersed,
   and wherein the first oxide component is a lead-containing oxide.

2. The paste composition of claim 1, wherein the second component is present in an amount ranging from 0.05% to 7.5%, as measured by weight percentage of the paste composition.

3. The paste composition of claim 1, wherein the first oxide component is present in an amount ranging from 0.1% to 10% by weight of the paste composition.

4. The paste composition of claim 1, wherein the source of the electrically conductive metal comprises Ag powder.

5. The paste composition of claim 1, wherein the electrically conductive metal is substantially Al-free.

6. A process for forming on a substrate an electrically conductive structure comprising at least one electrode, the process comprising:
   a) providing a substrate having opposed first and second major surfaces with an insulating layer present on at least the first major surface;
   b) applying a paste composition of claim 1 onto a preselected portion of the first major surface; and
   c) firing the substrate and the paste composition thereon for a time and at a temperature sufficient to form the electrically conductive structure with electrical contact established between the at least one electrode and the preselected portion.

7. The process of claim 6, wherein the preselected portion consists essentially of p-type semiconductor material.

8. The process of claim 6, wherein:
   a) the electrically conductive structure comprises electrically separate first and second electrodes;
   b) the preselected portion comprises separate first and second subportions that consist essentially of p-type and n-type semiconductor material, respectively;
   c) the paste composition is applied onto both the first and second subportions; and
   d) the firing forms the electrically conductive structure, with electrical contact established between the first electrode and the first subportion and between the second electrode and the second subportion.

9. The process of claim 6, wherein:
   a) the electrically conductive structure comprises electrically separate first and second electrodes respectively located on the first and second major surfaces;
   b) the process further comprises applying the paste composition onto a preselected portion of the second major surface; and
   c) the firing forms the electrically conductive structure, with electrical contact established between the first electrode and the preselected portion of the first major surface and between the second electrode and the preselected portion of the second major surface,
   and wherein the preselected portion of the first major surface consists essentially of p-type semiconductor material and the preselected portion of the second major surface consists essentially of n-type semiconductor material.

10. An electrically conductive structure comprising an electrode contacting a p-type region of a silicon semiconductor, the electrically conductive structure having been formed by the process of claim 6.

11. A photovoltaic cell comprising a substrate and an electrically conductive structure thereon, the article having been formed by the process of claim 6.

12. A photovoltaic cell comprising a substrate and an electrically conductive structure thereon, the article having been formed by the process of claim 8.

13. A photovoltaic cell comprising a substrate and an electrically conductive structure thereon, the article having been formed by the process of claim 9.

14. A photovoltaic cell precursor, comprising:
   a) a substrate having opposed first and second major surfaces; and b) a paste composition as recited by claim 1, the paste composition being applied onto a preselected portion of the first major surface and configured to be formed by a firing operation into an electrically conductive structure comprising an electrode in electrical contact with the substrate.

15. The photovoltaic cell precursor of claim 14, wherein:
a) the preselected portion comprises separate first and second subportions that consist essentially of p-type and n-type semiconductor material, respectively;
b) the paste composition is applied onto the first and second subportions and configured to be formed by the firing operation into the electrically conductive structure comprising electrically separate first and second electrodes in electrical contact with the first and second subportions, respectively.

16. The photovoltaic cell precursor of claim 14, wherein:
a) the conductive structure comprises electrically separate first and second electrodes respectively located on the first and second major surfaces;
b) the paste composition is further applied onto a preselected portion of the second major surface such that the paste composition is further configured to be formed by the firing operation into a second electrode electrically separated from the first electrode, the first and second electrodes being in electrical contact with the preselected portions of the first and second major surfaces, respectively,
and wherein the preselected portion of the first major surface consists essentially of p-type semiconductor material and the preselected portion of the second major surface consists essentially of n-type semiconductor material.

17. The paste composition of claim 1, wherein the first oxide component is a lead borate oxide composition in which the lead and boron cations together comprise at least 50% of the total cations.

18. The paste composition of claim 1, wherein the first oxide component is a lead silicate oxide composition in which the lead and silicon cations together comprise at least 50% of the total cations.

19. The paste composition of claim 1, wherein the second component is $Mg_2Si$.

20. The paste composition of claim 2, wherein the second component is present in an amount ranging from 0.05% to 3%, as measured by weight percentage of the paste composition.

* * * * *